US007097955B2

(12) United States Patent
Yoshinari et al.

(10) Patent No.: US 7,097,955 B2
(45) Date of Patent: Aug. 29, 2006

(54) MULTICOLOR IMAGE FORMING MATERIAL AND MULTICOLOR IMAGE FORMING METHOD USING THE SAME

(75) Inventors: Shinichi Yoshinari, Shizuoka (JP); Shinji Fujimoto, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 357 days.

(21) Appl. No.: 10/332,900

(22) PCT Filed: Jul. 3, 2002

(86) PCT No.: PCT/JP02/06747

§ 371 (c)(1),
(2), (4) Date: Jan. 15, 2003

(87) PCT Pub. No.: WO03/016069

PCT Pub. Date: Feb. 27, 2003

(65) Prior Publication Data

US 2004/0058814 A1 Mar. 25, 2004

(30) Foreign Application Priority Data

Aug. 16, 2001 (JP) ........................ P 2001-247272
Aug. 16, 2001 (JP) ........................ P 2001-247273

(51) Int. Cl.
*G03F 7/34* (2006.01)
*G03F 7/105* (2006.01)

(52) U.S. Cl. .................. 430/200; 430/201; 430/271.1; 430/964

(58) Field of Classification Search ................ 430/200, 430/201, 964, 271.1
See application file for complete search history.

(56) References Cited

U.S. PATENT DOCUMENTS 5,759,738 A * 6/1998 Tsuno et al. ................ 430/200

(Continued)

FOREIGN PATENT DOCUMENTS

EP 0689940 A1 1/1996

(Continued)

*Primary Examiner*—Richard L. Schilling
(74) *Attorney, Agent, or Firm*—Sughrue Mion, PLLC

(57) ABSTRACT

The invention provides a multi-color image-forming material for recording an image by using an image-receiving sheet having an image-receiving layer and at least 4 kinds of heat transfer sheets different from each other in color and comprising a support having provided thereon at least a light-to-heat conversion layer and an image-forming layer, superposing the image-forming layer of each of the thermal transfer sheet on the image-receiving layer of the image-receiving sheet, in which the image-forming layer is opposed to the image-receiving layer, and irradiating a laser light thereto to transfer the laser-irradiated area of the image-forming layer to the image-receiving layer of the image-receiving sheet, wherein the material contains a heat transfer sheet (X) having an image-forming layer containing one selected from among Pigment Red 48:1, Pigment Red 48:3, Pigment Green 7, Pigment Blue 15:6, Pigment Blue 60, Pigment Violet 23 and Pigment Orange 43, and a method for forming a multi-color image comprises using an image-receiving sheet having an image-receiving layer and at least 5 kinds of heat transfer sheets including thermal transfer sheets for a color of yellow, magenta, cyan or black and each comprising a support having provided thereon at least a light-to-heat conversion layer and an image-forming layer, superposing the image-forming layer of each of the thermal transfer sheet on the image-receiving layer of the image-receiving sheet, and irradiating a laser light thereto to transfer the laser-irradiated area of the image-forming layer to the image-receiving layer of the image-receiving sheet and effect image recording, thus providing a multi-color image having an enlarged scope of reproducible hues.

2 Claims, 5 Drawing Sheets

U.S. PATENT DOCUMENTS

| | | | | |
|---|---|---|---|---|
| 6,027,850 | A * | 2/2000 | Kawakami et al. | 430/201 |
| 6,051,318 | A * | 4/2000 | Kwon | 428/413 |
| 6,099,994 | A * | 8/2000 | Chang et al. | 430/20 |
| 6,190,827 | B1 * | 2/2001 | Weidner | 430/201 |
| 6,197,474 | B1 * | 3/2001 | Niemeyer et al. | 430/201 |
| 6,235,445 | B1 * | 5/2001 | Nakamura et al. | 430/200 |
| 6,284,425 | B1 * | 9/2001 | Staral et al. | 430/201 |
| 6,294,308 | B1 * | 9/2001 | Caspar et al. | 430/200 |
| 6,326,121 | B1 * | 12/2001 | Takahashi | 430/200 |
| 6,458,504 | B1 * | 10/2002 | Wachi et al. | 430/200 |
| 6,468,634 | B1 * | 10/2002 | Miyake et al. | 428/32.6 |
| 6,482,768 | B1 * | 11/2002 | Yoshinari et al. | 503/227 |
| 6,593,060 | B1 * | 7/2003 | Konuma | 430/271.1 |
| 6,830,863 | B1 * | 12/2004 | Wachi et al. | 430/200 |
| 2001/0004509 | A1 * | 6/2001 | Hayashi | 430/200 |
| 2002/0187418 | A1 * | 12/2002 | Nakamura et al. | 430/200 |

FOREIGN PATENT DOCUMENTS

| | | | |
|---|---|---|---|
| JP | 5-58045 | A | 3/1993 |
| JP | 8-283319 | A | 10/1996 |
| JP | 9-52458 | A | 2/1997 |
| JP | 11-157218 | A | 6/1999 |
| JP | 2000-355177 | * | 12/2000 |
| JP | 2001-39040 | A | 2/2001 |

* cited by examiner

● : HUES REPRODUCED BY PROCESS COLOR
× : COLORS REPRODUCED BY EXAMPLES

MULTICOLOR IMAGE FORMING MATERIAL AND MULTICOLOR IMAGE FORMING METHOD USING THE SAME

TECHNICAL FIELD

The present invention relates to a multi-color image-forming material for forming a full-color image with a high resolution using a laser light, and to a method for forming a multi-color image using the same. In particular, the invention relates to a multi-color image-forming material useful for producing a color proof (DDCP: Direct Digital Color Proof) in the printing field or a mask image based on digital image signals by laser recording and to a method for producing a multi-color image using the same.

BACKGROUND OF THE INVENTION

In the field of graphic arts, printing of a press plate has been conducted using a set of color separation films prepared from a color original by using lith type films. In general, a color proof is produced from color separation films, before printing (actual printing work), in order to check for errors in the color separation step or necessity of color compensation. The color proof is desired to realize an enough high resolution to permit high reproduction of a middle tone image, a high step stability and the like. In addition, in order to obtain a color proof similar to actual printed products, it is preferred to use, as materials for the color proof, those which are used for actual printed products—for example, regular printing papers as substrates, and pigments as coloring materials. Also, as a method for producing a color proof, a dry method is more desired which does not use any developing solution.

With the recent diffusion of electronic systems in the pre-printing step (pre-press field), there has been developed, as a dry method for producing a color proof, a recording system wherein a color proof is directly produced from digital signals. Such electronic system intends to produce, particularly, color proofs with a high image quality and, in general, it reproduces a half-tone dot image of 150 lines/inch or more. In order to record a high-quality proof from digital signals, a laser light which can be modulated by digital signals and permits to finely focus the recording light is used as a recording head. Thus, it has become necessary to develop an image-forming material which shows a high recording sensitivity to a laser light and an enough high resolving power to permit reproduction of highly fine half-tone dots.

As an image-forming material to be used for a transfer image-forming method using a laser light, there has been known a heat-melting transfer sheet comprising a support having provided thereon a light-to-heat conversion layer capable of absorbing a laser light to generate heat and an image-forming layer wherein a pigment is dispersed in a heat-meltable binder such as wax or a binder, in this order (Japanese Patent Laid-Open No. 58045/1993). In the image-forming method using such image-forming materials, heat generated in the laser light-irradiated area of the light-to-heat conversion layer melts the image-forming layer of the corresponding area, and the molten portion of the image-receiving layer is transferred to an image-receiving sheet disposed, in layers, on the transfer sheet, thus a transfer image being formed on the image-receiving sheet.

Also, Japanese Patent 219052/1994 discloses a heat transfer sheet which comprises a support having provided thereon a light-to-heat conversion layer containing a light-heat converting substance, an extremely thin (0.03 to 0.3 μm) heat releasable layer and an image-forming layer containing a coloring material in this order. In this thermal transfer sheet, the binding force between the image-forming layer and the light-to-heat conversion layer which are bound to each other by the heat releasable layer provided therebetween is reduced by irradiation of a laser light, and a highly fine image is formed on an image-receiving layer disposed, in layers, on the thermal transfer sheet. The aforesaid image-forming method using the thermal transfer sheet utilizes so-called "abrasion". Specifically, the method utilizes the phenomenon that the heat releasable layer is partly decomposed in the area which has been irradiated with a laser light, and is gasified, and hence bonding force between the image-forming layer and the light-to-heat conversion layer is so weakened in the laser-irradiated area that the image-forming layer in the area is transferred to the image-receiving sheet superimposed thereon.

These image-forming methods have the advantages that regular printing paper having provided thereon an image-receiving layer (adhesive layer) can be used as an image-receiving sheet material, and that a multi-color image can easily be obtained by successively transferring images with a different color onto the image-receiving sheet. In particular, the image-forming method utilizing abrasion has the advantage that a highly fine image can be obtained with ease, and is useful for producing a color proof (DDCP: Direct Digital Color Proof)or a highly fine mask image.

With the progress of DTP environment, there is an increasing need for proof by DDCP system among users of CTP (Computer To Plate) instead of the proof system of a conventional proof or of an analogue technique, because an intermediate film-producing step can be eliminated. In recent years, there has been desired a large-sized DDCP having a high quality, a high stability and an excellent printing compatibility.

The laser thermal transfer method permits printing with a high resolution, and there have conventionally been such systems as (1) laser sublimation system, (2) laser abrasion system, and (3) laser melting system. Howver, all of them involve the problem that form of recorded half-tone dots is not sharp. The laser sublimation system (1) involves the problem that, since it uses dyes as coloring materials, similarity to printed products is not enough and, in addition, outline of half-tone dots becomes blurred due to sublimation properties of the coloring materials, thus resolution not being sufficiently high. On the other hand, the laser abrasion system shows a good similarity to printed products since it uses pigments as coloring materials but, since the coloring materials are scattered in this system, outline of half-tone dots become blurred similarly with the sublimation system, thus resolution not being sufficiently high. Further, the laser melting system (3) involves the problem that clear outline cannot be formed due to flow of the molten substance.

Also, the conventionally employed thermal transfer sheets are limited to so-called process color technique using the four colors of yellow, magenta, cyan and black, thus the range of reproducible hues being limited.

The subject of the invention is to solve the aforesaid problems with conventional art, and to attain the following objects. That is, an object of the invention is to provide a multi-color image-forming material which can reproduce an expanded range of hues, and a multi-color image-forming method using the same. Further, another object of the invention is to provide a multi-color image-forming material capable of providing a large-sized DDCP having a high quality, a high stability and an excellent printing compatibility, and a multi-color image-forming method using the same. Also, a further object of the invention is to provide a multi-color image-forming material which can form an image with a good image quality and a stable transfer density even when subjected to laser recording with a high energy by a laser light of multi-beams, and a multi-color image-forming method using the same.

DISCLOSURE OF THE INVENTION

That is, means to solve the aforesaid problems is as follows.

(1) A multi-color image-forming material for recording an image by:

using an image-receiving sheet having an image-receiving layer and at least 4 kinds of heat transfer sheets, each of which is different from each other in color and comprises a support having provided thereon at least a light-to-heat conversion layer and an image-forming layer;

superposing the image-forming layer in each of the thermal transfer sheet on the image-receiving layer of the image-receiving sheet, in which the image-forming layer is opposed to the image-receiving layer; and irradiating a laser light thereto to transfer the laser-irradiated area of the image-forming layer to the image-receiving layer of the image-receiving sheet, wherein the multi-color image-forming material includes a heat transfer sheet (X) having an image-forming layer containing one selected from Pigment Red 48:1, Pigment Red 48:3, Pigment Green 7, Pigment Blue 15:6, Pigment Blue 60, Pigment Violet 23 and Pigment Orange 43.

(2) The multi-color image-forming material as described in (1), wherein the thermal transfer sheet (X) is a thermal transfer sheet other than the thermal transfer sheet for a color of yellow, magenta, cyan or black, and the hue of the image-forming layer is outside the scope of hues reproducible by the single use or combined use of the thermal transfer sheet for a color of yellow, magenta, cyan or black.

(3) The multi-color image-forming material as described in (2), wherein the image-forming layer of the thermal transfer sheet (X) has a hue of L*=48 to 58, a*=69 to 79, b*=36 to 46;

L*=16 to 26, a*=19 to 29, b*=−63 to −73;

L*=57 to 67, a*=−73 to −83, b*=26 to 36; or

L*=65 to 75, a*=50 to 60, b*=81 to 91.

(4) The multi-color image-forming material as described in any one of (1) to (3), wherein the transferred image has a resolution of 2400 dpi or more.

(5) The multi-color image-forming material as described in (4), wherein the transferred image has a resolution of 2600 dpi or more.

(6) The multi-color image-forming material as described in any one of (1) to (5), wherein the ratio of the optical density of the light-to-heat conversion layer of each of the thermal transfer sheets ($OD_{LH}$) to the thickness of the light-to-heat conversion layer ($T_{LH}$): $OD_{LH}/T_{LH}$ (unit: μm) is 4.36 or more.

(7) The multi-color image-forming material as described in any one of (1) to (6), wherein the ratio of the optical density ($OD_I$) to the thickness of the image-forming layer ($T_I$): $OD_I/T_I$ (unit: μm) is 1.80 or more, in which $OD_I$ represents the maximum optical density among the red filter, blue filter and green filter of the image-forming layer of each of the heat transfer sheet.

(8) The multi-color image-forming material as described in any one of (1) to (7), wherein the recording area of the multi-color image is of a size of 515 mm or more×728 mm or more.

(9) The multi-color image-forming material as described in (8), wherein the recording area of the multi-color image is of a size of 594 mm or more×841 mm or more.

(10) The multi-color image-forming material as described in any one of (1) to (9), wherein the contact angle of the image-forming layer of each of the thermal transfer sheet with water and the contact angle of the image-receiving layer of the image-receiving sheet with water are in the range of from 7.0 to 120.0°.

(11) The multi-color image-forming material as described in any one of (1) to (10), wherein the contact angle of the image-receiving sheet with water is 86° or less.

(12) A method for forming a multi-color image, which comprises:

using an image-receiving sheet having an image-receiving layer and at least 5 kinds of heat transfer sheets including thermal transfer sheets for a color of yellow, magenta, cyan or black, each of which comprises a support having provided thereon at least a light-to-heat conversion layer and an image-forming layer;

superposing the image-forming layer of each of the thermal transfer sheet on the image-receiving layer of the image-receiving sheet, in which the image-forming layer is opposed to the image-receiving layer; and irradiating a laser light thereto to transfer the laser-irradiated area of the image-forming layer to the image-receiving layer of the image-receiving sheet and record an image.

(13) The method for forming a multi-color image as described in (12), which at least uses the multi-color image-forming material described in any one of (1) to (11).

As a result of intensive investigations to provide DDCP with a high quality, a high stability and an excellent printing compatibility and of a large size of B2/A2 or more, further B1/A1 or more, the inventors have developed an image-forming material of the type of regular paper transfer, real half-tone dot output and pigment and of a size of B2 or more, and a laser thermal transfer recording system for DDP comprising an output machine and a high-quality CMS software.

The characteristic aspects of the performance of the laser thermal transfer recording system that the inventors have developed, system constitution and outline of the technical points are as follows. The characteristic aspects are: (1) Half-tone dots excellent in similarity to printed products can be reproduced, since shape of the dots are sharp. (2) Hues are good in similarity to printed products. (3) A stable proof can be produced, since recording quality is difficultly influenced by ambient temperature or humidity, and repeated reproducibility is good. Technical points of the material which shows such characteristic performance lie in establishment of the thin film transfer technique, and improvement of vacuum contact retention of the material, following properties to high-resolution recording and heat resistance required for the laser heat transfer system. To be specific, there may be illustrated (1) reduction of the thickness of the light-heat converting layer by introducing an infrared ray-absorbing dye; (2) enhancement of heat resistance of the light-to-heat conversion layer by introducing a high-Tg polymer; (3) stabilization of hue by introducing a heat-resistant pigment; (4) control of adhesion force and cohesion force by adding wax or a low molecular component such as an inorganic pigment; and (5) imparting vacuum adhesion properties without deteriorating image quality, by adding a matting agent to the light-to-heat conversion layer. As the technical points of the system, there may be illustrated (1) air conveyance for continuously stacking a number of sheets in a recording apparatus; (2) insertion of regular paper on the image-receiving sheet for reducing curling after transfer in a thermal transfer apparatus; and (3) connection of a general-purpose output driver having system connection-enlarging properties. Thus, the laser thermal transfer recording system we have developed is constituted by a variety of performance characteristics, system constitution and technical points. These are, however, only illustrative, and the invention is not limited to these means.

We have conducted development based on the idea that individual materials, individual coating layers such as a light-to-heat conversion layer, a thermal transfer layer, and an image-receiving layer, and individual thermal transfer sheets and the image-receiving sheet should not independently exist but should be constituted so as to function organically and comprehensively and, further, that these image-forming materials can exhibit their best performance when combined with a recording apparatus and a thermal transfer apparatus. We have sufficiently examined individual coating layers of the image-forming material and materials constituting it, and have produced a coating layer which can bring out the maximum advantages of the materials to thereby produce an image-forming material, and have found appropriate ranges of various physical properties where the image-forming material can exhibit its maximal performance. As a result, they have unexpectedly found a high-performance image-forming material by studying thoroughly the relationship between individual materials, individual coating layers or individual sheets and the physical properties and organically and comprehensively combining the image-forming material with a recording apparatus or a thermal transfer apparatus.

The role of the invention in the system we have developed is to provide a multi-color image-forming material exhibiting the above-described high performance, and a method for forming a multi-color image using the same. The present invention is an important invention which can provide a multi-color image having a hue not obtainable by the conventional process color.

That is, the multi-color image-forming material of the invention is characterized in that it contains a thermal transfer sheet (X) having an image-forming layer containing one selected from among Pigment Red 48:1, Pigment Red 48:3, Pigment Green 7, Pigment Blue 15:6, Pigment Blue 60, Pigment Violet 23 and Pigment Orange 43. One or more of the thermal transfer sheets (X) may be used, and they are not limited as to hue. However, the hue is preferably red, blue, green or orange.

As the thermal transfer sheet (X) for a color of, for example, red, there are illustrated those which contain Pigment red 48:1 and/or Pigment Red 48:3 and, as that for a color of green, there are illustrated those which contain Pigment Green 7 and, as that for a color of blue, there are illustrated those which contain Pigment Blue 15:6 and/or Pigment Blue 60 and/or Pigment Violet 23 and, as that for a color of orange, there are illustrated those which contain Pigment Orange 43. These thermal transfer sheets (X) of individual colors may contain one or more pigments other than the above-described ones.

Also, other thermal transfer sheets than the thermal transfer sheet (X) in the multi-color image-forming material of the invention comprise at least three kinds of thermal transfer sheets and commonly comprise thermal transfer sheets for a color of yellow, magenta or cyan and, further, a thermal transfer sheet for a color of black may be contained.

As the thermal transfer sheet (X), a thermal transfer sheet other than the thermal transfer sheet for a color of yellow, magenta, cyan or black and which forms on the image-forming layer a hue outside the scope of hues reproducible by the single use or combined use of the thermal transfer sheet for a color of yellow, magenta, cyan or black is preferred, since it more expands the scope of reproducible hues.

The hue on the image-forming layer by the thermal transfer sheet (X) (hereinafter also referred to as hue (X)) realizing the hue outside the scope of hues reproducible by the single use or combined use of the thermal transfer sheet for a color of yellow, magenta, cyan or black (scope of hues reproducible by so-called process color) is preferably one of L*=48 to 58, a*=69 to 79, b*=36 to 46; L*=16 to 26, a*=19 to 29, b*=−63 to −73; L*=57 to 67, a*=−73 to −83, b*=26 to 36; or L*=65 to 75, a*=50 to 60, b*=81 to 91, wherein L*, a* and b* are elements of an L*a*b* calorimetric system.

The multi-color image-forming method of the invention is characterized by using at least 5 kinds of thermal transfer sheets including thermal transfer sheets for a color of yellow, magenta, cyan or black, in other words, using one or more kinds of thermal transfer sheets other than the thermal transfer sheets for a color of yellow, magenta, cyan or black to conduct laser thermal transfer.

The hue of the thermal transfer sheet other than the thermal transfer sheet for a color of yellow, magenta, cyan or black is not particularly limited as long as it is of a color different from the color of the image-forming layer of the thermal transfer sheet for a color of yellow, magenta, cyan or black but, in order to enlarge the scope of reproducible hues, the hue is preferably outside the scope of hue region reproducible by the single use or combined use of the thermal transfer sheet for a color of yellow, magenta, cyan or black. The thermal transfer sheet (X) capable of realizing the above-described hue (X) is illustrated as a preferred one.

In the multi-color image-forming method of the invention, it is preferred to use at least the multi-color image-forming material of the invention. That is, in the multi-color image-forming material of the invention, it is preferred to use at least thermal transfer sheets respectively for colors of yellow, magenta, cyan and black as other thermal transfer sheets than the thermal transfer sheet (X).

In the invention, the ratio of the optical density ($OD_{LH}$) of the light-to-heat conversion layer of the thermal transfer sheet and thickness ($T_{LH}$) of the light-to-heat conversion layer, $OD_{LH}/T_{LH}$ (unit: μm) is preferably controlled to be 4.36 or more. There is no limit as to the upper limit of $OD_{LH}/T_{LH}$ and, the larger, the more preferred. At present, however, the upper limit is about 10 in consideration of balance with other characteristic properties.

In the invention, $OD_{LH}$ of the thermal transfer sheet means absorbance of the light-to-heat conversion layer at a peak wavelength of a laser light to be used upon recording of the image-forming material of the invention, and can be measured using a known spectrophotometer. In the invention, a UV-spectrophotometer, UV-240 (made by Kabushiki Kaisha Shimazu Seisakusho), was used. Also, the $OD_{LH}$ is a value calculated by subtracting the value for the support alone from the value for the thermal transfer sheet including the support.

$OD_{LH}/T_{LH}$ relates to thermal conductivity, and can be an indication greatly influencing sensitivity and temperature humidity dependence of recording. By controlling $OD_{LH}/T_{LH}$ within the above-described scope, transfer sensitivity to the image-receiving sheet upon recording can be enhanced and, at the same time, temperature humidity dependence upon recording can be reduced.

That is, by increasing $OD_{LH}/T_{LH}$, recording of image can be conducted with a resolution of preferably 2400 dpi, more preferably 2600 dpi or more, and a size of a recording area of preferably 515 mm or more×728 mm or more, more preferably 594 mm or more×841 mm or more.

Also, the thickness of the light-to-heat conversion layer is preferably 0.03 to 1.0 μm, more preferably 0.05 to 0.5 μm.

Also, the ratio of the optical density ($OD_I$) of the image-forming layer of the thermal transfer sheet to the thickness of the image-forming layer $T_I$, $OD_I/T_I$ (unit: μm), is preferably 1.5 or more, more preferably 1.8 or more, particularly preferably 2.50 or more. The upper limit of $OD_I/T_I$ is not particularly limited and, the greater, the more preferred. At present, however, the upper limit is about 6 in consideration of other characteristic properties.

$OD_I/T_I$ can be an indication of a transfer density of the image-forming layer and a resolution of a transferred image. By controlling $OD_I/T_I$ within the above-described scope, there can be obtained an image with a high transfer density and a good resolution. Also, by reducing the thickness of the image-receiving layer, color reproducibility can be improved.

$OD_I$ means a reflection optical density obtained by transferring an image transferred from the thermal transfer sheet to the image receiving sheet further to regular paper of Tokuryo art paper, and measuring using a densitometer (X-rite 938; made by X-rite Co.) with each color mode of yellow (Y), magenta (M), cyan (C), black (K) or the like. That is, $OD_I$ of each thermal transfer sheet for any color to be used in the invention means the maximal value measured through a red filter (filter for cyan), a blue filter (filter for yellow) or a green filter (filter for magenta).

$OD_I$ is preferably 0.5 to 3.0, more preferably 0.8 to 2.0.

Further, the contact angle of the image-forming layer of each thermal transfer sheet to water and the contact angle of the image-receiving layer of the image-receiving sheet to water are preferably in the range of from 7.0 to 120.0 degrees, respectively. The contact angle is an indication of compatibility between the image-forming layer and the image-receiving layer, i.e., transfer properties, and is more preferably 30.0 to 100.0°. Also, the contact angle of the image-receiving layer to water is still more preferably 86° or less. Controlling the contact angles within the above-described range serves to enhance transfer sensitivity and reduce temperature humidity dependence of recording properties, thus being preferred.

Also, the contact angle of the surface of each layer of the invention to water is a value obtained by measuring using a contact angle meter, model CA-A (made by Kyowa Kaimen Kagaku K.K.)

As is described above, the characteristic aspect of the invention lies in that a recorded image with a large size can be formed by using a surface tension reducing agent. The recording area of a multi-color image is preferably of a size of 515 mm or more×728 mm or more, more preferably 594 mm or more×841 mm or more. The size of the image-receiving sheet is 465 mm or more×686 mm or more.

Next, the whole system we have developed is described below including the contents of the invention. In the system of the invention, a high resolution and a high image quality can be attained by inventing and employing a thin film thermal transfer system. The system of the invention enables to obtain a transferred image of 2400 dpi or more, preferably 2600 dpi or more, in resolution. The term "thin film thermal transfer system" means a system wherein a thin image-forming layer of 0.01 to 0.9 μm in thickness is transferred to an image-receiving sheet in a partially non-molten state or in a scarcely molten state. That is, the recorded portion is transferred as a thin film, and hence the thus developed thermal transfer system provides an extremely high resolution. In a preferred method for effectively conducting the thin film thermal transfer, the interior of the light-to-heat conversion layer is deformed into a shape of dome by recording with a light to thereby push up the image-forming layer and increase adhesion force between the image-forming layer and the image-receiving layer, thus transfer being made easy. When this deformation is large, the force of pushing the image-forming layer to the image-receiving layer is large enough to make transfer easy whereas, when small, the force of pushing the image-forming layer to the image-receiving layer is so insufficient that there remain portions which cannot be sufficiently transferred. Hence, deformation preferred for the thin film transfer can be evaluated in terms of the deformation ratio calculated by adding a cross-sectional area (a) of the recorded portion of the light-to-heat conversion layer increased after recording with a light and a cross-sectional area (b) of the light-to-heat conversion layer before recording with a light, dividing the resulting numerical value by the cross-sectional area (b) of the light-to-heat conversion layer before recording with a light, then multiplying the resulting value by 100, the cross-sectional area being measured by observing under a laser microscope (VK8500; made by Kihensu K. K.). That is, the deformation ratio=$\{(a+b)/b\}\times100$. The deformation ratio is 110% or more, preferably 125% or more, more preferably 150% or more. When elongation at break is made large enough, the deformation ratio may be 250% or more but, usually, it is preferred to depress the deformation ratio at about 250%.

Technical points of the image-forming material in the thin film transfer are as follows.

1. Compatibility of High Thermal Response with Storage Properties:

In order to attain a high image quality, transfer of sub-micron order thin film is necessary but, in order to obtain a desired density, it is necessary to make a layer wherein a pigment is dispersed in a high concentration, which conflicts with the thermal response. Also, the thermal response conflicts with storage properties (adhesion). The problem of these conflicting relations are solved by developing a novel polymer and a novel additive.

2. Ensuring High Vacuum Adhesion:

In the thin film transfer pursuing a high resolution, a smooth transfer interface is preferred which, however, fails to provide a sufficient vacuum adhesion. Not caught by the conventional knowledge with respect to vacuum adhesion, a matting agent with a comparatively small particle size is incorporated in a layer under the image-forming layer to thereby keep an appropriate gap between the thermal transfer sheet and the image-receiving sheet, thus vacuum adhesion being imparted without transfer failure of the image due to the mating agent and with maintaining the characteristic aspects of the thin film transfer.

3. Use of a Heat-Resistant Organic Material:

The temperature of the light-to-heat conversion layer for converting a laser light to heat upon laser recording reaches as high as about 700° C., and the temperature of the image-forming layer containing the pigment colorant reaches as high as about 500° C. As a material for the light-to-heat conversion layer, there has been developed a modified polyimide capable of being coated by using an organic solvent and, as a pigment colorant, there has been developed a pigment which has a higher heat resistance than pigments for use in printing, and is stable and has a proper hue.

4. Ensuring Surface Cleanness:

In the thin film transfer, dusts between the thermal transfer sheet and the image-receiving sheet can cause image defects, thus causing serious problems. It is not sufficient to control materials, because dusts enter there into from outside the devices or upon cutting of the materials. Thus it has been necessary to install a mechanism for removing dusts in the devices. However, a material has been found which permits to keep an enough appropriate adhesion to clean the surface of the transfer material, and removal of dusts can be realized without reduction in productivity by changing the material of conveying rollers.

The whole system of the invention is described in detail below.

The invention preferably realizes a thermal transfer image composed of sharp half-tone dots, and permits transfer onto regular paper and recording of a size of B2 or larger (515 mm or more×728 mm or more). The system is a system which permits recording of a size larger than a size of 543 mm×765 mm which is the size of B2.

One of the advantages of the performance of the system developed by the invention is that sharp-shaped dots can be obtained. The thermal transfer image obtained by this system can be a half-tone dot image having a resolution of 2400 dpi or more corresponding to the printing line number. Each half-tone dot scarcely has blur and chip, and has such a sharp shape that a greatly wide range of half-tone dots of from high-light to shadow can be clearly formed. As a result, a high-quality half-tone dot output having the same resolution as that of an image setter or a CTP setter is possible, thus half-tone dots and gradation well similar to printed products being reproducible.

Also, a second advantage of the performance of the system developed by the invention is the good repeated reproducibility.

Since the shape of half-tone dots of the thermally transferred image is so sharp that half-tone dots corresponding to the laser beam can be reproduced with good fidelity. Also, since dependence of recording properties upon environmental temperature and humidity is so small that repeated reproducibility with stable hue and density can be obtained under an environment of a wide range of temperature and humidity.

Further, a third advantage of the performance of the system developed by the invention is good color reproducibility. The thermally transferred image obtained by this system is formed by colored pigments which are used for printing inks, and has a good repeated reproducibility, and hence it can realize a high-accuracy CMS (Color Management System).

Also, the hue of this thermally transferred image can be made almost the same as the hue of Japan color, SWOP color or the like, i.e., the hue of a printed product. In addition, as to how the color looks under a different light source such as a fluorescent lamp or an incandescent lamp, it can show the same change as with printed products.

Also, the fourth advantage of the performance of the system developed by the invention is a good letter quality. The dot shape of the thermally transferred image obtained by this system is so sharp that fine lines of fine letters can be reproduced with a distinct outline.

Next, technical characteristic aspects of materials used in the system of the invention are described in more detail below. As the thermal transfer systems for DDCP, there are (1) sublimation system, (2) abrasion system and (3) thermally melting system. The systems (1) and (2), wherein coloring materials are sublimed or scattered, provide half-tone dots having a blurred outline. On the other hand, the system (3) does not give half-tone dots a clear outline due to the flow of the molten materials. In order to solve the new problems with the laser thermal transfer system and obtain a higher image quality, we have incorporated the techniques described below on the basis of the thin film transfer technology. The first characteristic aspect of the techniques with respect to the materials is to sharpen the shape of half-tone dots. A laser light is converted to heat in the light-to-heat conversion layer, and the thus generated heat is conducted to the adjacent image-forming layer, and the image-forming layer is in turn adhered to the image-receiving layer to conduct image recording. In order to make the shape of half-tone dots sharp, it suffices that the heat generated by the laser light is conducted to the transfer interface without diffusing in the plane direction, and that the image-forming layer is sharply broken at the heated portion/non-heated portion boundary. For this purpose, the thickness of the light-to-heat conversion layer in the thermal transfer sheet is reduced, and dynamic properties of the image-forming layer are controlled.

Technique 1 for sharpening the shape of half-tone dots is to reduce the thickness of the light-to-heat conversion layer. It is surmised by simulation that the temperature of the light-to-heat conversion layer instantaneously reaches about 700° C. and, when thickness of the layer is thin, deformation or breakage is liable to occur. When deformation or breakage occurs, there arises actual damages that the light-to-heat conversion layer is transferred to the image-receiving sheet together with the image-forming layer and that there is formed an uneven transferred image. On the other hand, in order to obtain a predetermined level of temperature, a light-to-heat conversion substance must be allowed to exist at a high concentration in the layer, which causes the problem of precipitation of the pigment or migration of the pigment to adjacent layers. As the light-to-heat conversion substance, carbon has often been used but, in the material of the invention, an infrared absorbing coloring material is used which serves to reduce the amount thereof to be used in comparison with carbon. As the binder, a polyimide series compound is introduced which shows an enough dynamic strength even at a high temperature and well retains the infrared absorbing coloring material.

Thus, it is preferred to reduce the thickness of the light-to-heat conversion layer to about 0.5 μm or less by selecting an infrared absorbing coloring material having excellent light-to-heat conversion properties and a heat resistant binder such as a polyimide series binder.

Also, technique 2 for sharpening the shape of half-tone dots is to improve characteristic properties of the image-forming layer. When deformation of the light-to-heat conversion layer takes place or the image-forming layer itself is deformed by the intense heat, the image-forming layer transferred to the image-receiving layer generates unevenness in thickness corresponding to the sub-scanning pattern of a laser light, and hence there results a non-uniform image and an apparent reduction in transfer density. This tendency becomes more serious as the image-forming layer is thinner.

On the other hand, when the image-forming layer is thick, sharpness of resultant half-tone dots is damaged, and the sensitivity is reduced.

In order to make the conflicting performances be compatible with each other, it is preferred to improve transfer unevenness by adding a low-melting substance such as wax to the image-forming layer. Also, by adding inorganic fine particles in place of the binder to thereby properly increase thickness of the layer, the image-forming layer can be sharply broken at the boundary between heated portion and non-heated portion, thus transfer unevenness being removed while maintaining sharpness of half-tone dots and sensitivity.

Also, the low-melting substances such as wax generally tend to ooze onto the surface of the image-forming layer or crystallize, and in some cases cause problems with respect to image quality and stability with time of the thermal transfer sheet.

In order to meet the problems, it is preferred to use a low-melting substance which has an Sp value slightly different from that of the polymer in the image-forming layer. Such substance can enhance compatibility with the polymer and can prevent separation of the low-melting substance from the image-forming layer. Also, it is preferred to mix several kinds of low-melting substances different from each other in structure to form an eutectic mixture which serves to prevent crystallization. As a result, there can be obtained an image wherein the shape of half-tone dots is sharp and which forms less unevenness.

Also, a second characteristic aspect of the techniques with respect to the materials lies in the finding that there exists a temperature humidity dependence of the recording sensitivity. In general, dynamic physical properties and thermal physical properties are changed when the coating layer of the thermal transfer sheet absorbs moisture, and there arises humidity dependence of recording environment.

In order to reduce the temperature humidity dependence, it is preferred to make the coloring material/binder system of the light-to-heat conversion layer and the binder system of the image-forming layer to be an organic solvent system. Also, it is preferred to select polyvinyl butyral as a binder for the image-receiving layer and introduce a polymer-hydrophilizing technique for reducing its water absorption. As the polymer-hydrophilizing technique, there are illustrated the technique of reacting hydroxyl groups with hydrophobic groups as described in Japanese Patent Laid-Open No. 238858/1996 or the technique of crosslinking two or more hydroxyl groups with a hardener.

A third characteristic aspect of the techniques with respect to the materials lies in the improvement of similarity to printed products with respect to hue. The following problems newly arising with the laser thermal transfer system are solved in addition to the problem on color matching and stable dispersion of pigments with respect to thermal head system color proof (e.g., First Proof made by Fuji Photo Film Co., Ltd.). That is, technique 1 for improving similarity to printed products with respect to hue lies in the use of highly heat-resistant pigments. Usually, a heat of about 500° C. or higher is applied to the image-forming layer upon printing by exposure with a laser light, and some of conventionally used pigments are decomposed by the heat. This thermal decomposition can be prevented by employing highly heat-resistant pigments in the image-forming layer.

And, technique 2 for improving similarity to printed products with respect to hue is to prevent diffusion of the infrared absorbing coloring materials. In order to prevent change of hue by migration of the infrared absorbing coloring material from the light-to-heat conversion layer to the image-forming layer due to the intense heat upon printing, it is preferred to design the light-to-heat conversion layer employing the combination of infrared absorbing coloring material/binder showing a strong retaining force as has been described hereinbefore.

A fourth characteristic aspect of the techniques with respect to the materials is an increased sensitivity. In general, high-speed printing gets into energy insufficiency and, in particular, space generates corresponding to the interval of sub-scanning of a laser light. As has been described hereinbefore, the increased density of coloring material in the light-to-heat conversion layer and reduction in thickness of the light-to-heat conversion layer and the image-forming layer serve to enhance efficiency of heat generation/heat conduction. Further, it is preferred to add a low-melting substance to the image-forming layer for the purpose of obtaining the effect of the image-forming layer slightly flowing upon heating to fill up the gaps and enhancing adhesion to the image-receiving layer. Also, it is preferred to employ, as a binder for the image-receiving layer, for example, the same polyvinyl butyral as that used in the image-forming layer for the purpose of enhancing adhesion properties between the image-receiving layer and the image-forming layer and imparting sufficient strength of a transferred image.

A fifth characteristic aspect of the techniques with respect to the materials is improvement of vacuum adhesion properties. It is preferred to retain the image-receiving sheet and the thermal transfer sheet on a drum by vacuum adhesion. This vacuum adhesion is of importance since image transfer behavior is extremely sensitive to the clearance between the image-receiving layer surface of the image-receiving sheet and the image-forming layer surface of the transfer sheet because the image is formed by controlling adhesion force of the two sheets. When the clearance between the materials is increased due to the presence of a foreign matter such as dust, there results image defect or unevenness of image transfer.

In order to prevent such image defect or unevenness of image transfer, it is preferred to form a uniform unevenness on the thermal transfer sheet to thereby realize good passage of the air and obtain a uniform clearance.

Technique 1 for improving vacuum adhesion is to make uneven the surface of the thermal transfer sheet. In order to obtain sufficient effect of vacuum adhesion even in the case of printing two or more colors in a superimposing manner, the unevenness is provided on the thermal transfer sheet. As methods for providing unevenness on the thermal transfer sheet, there are generally illustrated post-treatment such as emboss treatment and addition of a matting agent to the coating layer. However, in order to simplify the production steps and stabilize the materials with time, addition of a matting agent is preferred. As the matting agent, those which have a size larger than the thickness of the coating layer are required. Since addition of a matting agent to the image-forming layer causes the problem that an image portion where the matting agent exists is missing. Thus, it is preferred to add a matting agent having an optimal particle size to the light-to-heat conversion layer, whereby the image-forming layer itself has an almost uniform thickness, and a defect-free image can be formed on the image-receiving sheet.

Next, the characteristic aspects of the systematizing techniques of the system of the invention are described below. A first characteristic aspect of the systematizing techniques is a constitution of a recording apparatus. In order to surely reproduce half-tone dots having the above-described sharpness, the recording apparatus is required to be designed with a high accuracy. It has the same fundamental constitution as that of a conventional laser thermal transfer recording apparatus. This constitution is a so-called heat-mode outer drum recording system wherein a recording head equipped with a plurality of high-powered laser beams irradiates the thermal transfer sheet and the image-receiving sheet fixed on a drum with a laser light to conduct recording. Of those, the following embodiments are preferred constitutions.

Constitution 1 of the recording apparatus is to avoid inclusion of dust. The image-receiving sheet and the thermal transfer sheet are fed by a fully-automatic roll feeding. Since sheet feeding of a small number of sheets causes inclusion of dust generated from human body, roll feeding is employed.

Since one roll of the thermal transfer sheet corresponds to one color, the rolls for respective colors are changed by rotating a loading unit. Each film is cut into a predetermined length during loading, then fixed onto a drum. Constitution 2 of the recording apparatus is to strengthen adhesion between the image-receiving sheet and the thermal transfer sheet on the recording drum. Fixing of the image-receiving sheet and the thermal transfer sheet onto the recording drum is effected by vacuum suction. Fixing through mechanical means fails to strengthen the adhesion force between the image-receiving sheet and the thermal transfer sheet, and hence vacuum suction was employed. A number of vacuum suction holes are formed on the recording drum, and the inside of the drum is vacuumized by a blower or a vacuum pump to thereby adsorb the sheets to the drum. Since the thermal transfer sheet is adsorbed via the adsorbed image-forming sheet, the size of the thermal transfer sheet is made larger than the size of the image-receiving sheet. The air between the thermal transfer sheet and the image-receiving sheet which most largely influences the recording performance is sucked through the area outside the image-receiving sheet where only the thermal transfer sheet exists.

Constitution 3 of the recording apparatus is to stack a plurality of sheets on a discharge support. In the apparatus, many large-sized sheets of B2 size or larger can be stacked one over the other on the discharge support. When a subsequent sheet B is discharged on the image-receiving layer of an already stacked film A, the two sometimes stick together due to the thermal adhesion thereof. When such sticking takes place, the next sheet cannot be normally discharged, resulting in jamming, thus being problematical. In order to avoid the sticking, it is best to prevent contact between film A and film B. As countermeasures for preventing the contact, there have been known several methods. That is, there are (a) a method of providing a difference in level on the discharge support to make the film shape non-flat and generate a gap between the two films, (b) a method of providing a discharge outlet at a position higher than the discharge support, thus the films are dropped from above, and (c) a method of blowing an air between the two films to thereby set the next-discharged film afloat. In this system, the sheet size is as large as B2, and hence methods (a) and (b) require an extremely large structure, thus the air-blowing method (c) being employed. For this reason, the method of blowing an air between the two sheets to thereby set the next-discharged sheet afloat is to be employed.

An example of the constitution of this apparatus is shown in FIG. 2.

A sequence of forming a full-color image by applying the image-forming material to the apparatus (hereinafter referred to as "image-forming sequence of this system") is described below.

1) The sub-scanning axis of a recording head 2 in the recording apparatus 1 is reset along a sub-scanning rail 3, and the main-scanning revolving shaft of a recording drum 4 and a thermal transfer sheet-loading unit 5 are reset to the starting point.

2) An image-receiving sheet roll 6 is unwound by means of conveying rollers 7, and the top end of the image-receiving sheet is fixed on the recording drum 4 by vacuum suction through suctioning holes provided in the recording drum.

3) A squeeze roller 8 migrates downward onto the recording drum 4 to press down the image-receiving sheet and, when the image-receiving sheet is further conveyed over a predetermined distance by rotation of the drum, the sheet is cut into a predetermined length by means of a cutter 9.

4) The recording drum 4 rotates one more time to complete loading of the image-receiving sheet.

5) Next, a thermal transfer sheet K for the first color of black is unrolled from a thermal transfer sheet roll 10K, cut and loaded in the same sequence as with the image-receiving sheet.

6) Next, the recording drum 4 starts to rotate at a high speed, and the recording head 2 on the sub-scanning rail 3 starts to move and, when the head reaches the recording-starting position, a recording laser is irradiated onto the recording drum 4 by means of the recording head according to recording image signals. The irradiation is discontinued at a recording-completing position, and movement of the sub-scanning rail and rotation of the drum are stopped. The recording head on the sub-scanning rail is reset to the starting point.

7) The thermal transfer sheet K alone is peeled off, with leaving the image-receiving sheet on the recording drum. For this purpose, the tip of the thermal transfer sheet is clawed by a claw and pulled in the discharging direction, then discharged into a waste box 35 through a waste outlet 32.

8) The procedures 5) to 7) are repeated with respect to the remaining 4 colors or more. The recording order is, for example, black, cyan, magenta, yellow, red or, further, blue, orange, etc. That is, a thermal transfer sheet C for the second color of cyan is unrolled from a thermal transfer sheet roll 10C, a thermal transfer sheet M for the third color of magenta is unrolled from a thermal transfer sheet roll 10M, a fourth transfer sheet Y for the fourth color of yellow is unrolled from a thermal transfer sheet roll 10Y, and the fifth transfer sheet R for the fifth color of red is unrolled from a thermal transfer sheet roll 10R. This order is the reverse of general printing, because the order of the colors on regular paper is reversed in the step transferring onto regular paper to be conducted later. Additionally, the above-described order is not limitative at all.

9) When the above-described steps are completed, the recorded image-receiving sheet is finally discharged onto a discharge support 31. The image-receiving sheet is peeled off in the same manner as with the thermal transfer sheet in 7) but, as is different from the thermal transfer sheets, the image-receiving sheet is not discarded, and, when advanced to the waste outlet 32, it is returned to the discharge support. Upon being discharged onto the discharge support, air 34 is blown from under the discharge outlet 33 to permit stacking of a plurality of the image-receiving sheets.

It is preferred to use an adhesive roller having provided on the surface thereof an adhesive material as a roller 7 located at a position of either feeding or conveying the thermal transfer sheet roll and the image-receiving sheet roll.

By providing the adhesive roller, the surface of the thermal transfer sheet and the surface of the image-receiving sheet can be cleaned.

As the adhesive materials to be provided on the surface of the adhesive roller, there are illustrated an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer, an acrylonitrile-butadiene copolymer (NBR), a polyisoprene resin (IR), a styrene-isoprene copolymer (SIS), an acrylicester copolymer, a polyester resin, a polyurethane resin, an acryl resin, butyl rubber, polynorbornene, etc.

The adhesive roller can clean the surface of the thermal transfer sheet and the surface of the image-receiving sheet by coming into contact therewith. The contact pressure is not particularly limited so long as they are in contact with each other.

Vickers hardness of the adhesive material to be used for the adhesive roller, Hv, is preferably 50 kg/mm$^2$ (≈490 MPa) or less than that, because such material permits to sufficiently remove the foreign matter of dust and depressing image defects.

Vickers hardness is a hardness obtained by measuring hardness using a diamond pyramid indenter of 136 degrees in angle between the opposite faces to which a static load is applied, and is calculated by the following formula.

$$\text{Hardness } Hv=1.854\ P/d^2\ (kg/mm^2)\approx 18.1692\ P/d^2\ (MPa)$$

P: load (Kg);

d: length (mm) of a diagonal line of a square recess

Also, in the invention, elasticity modulus at 20° C. of the adhesive material to be used for the adhesive roller is preferably 200 kg/cm$^2$ (≈19.6 MPa) or less than that, because such material permits to sufficiently remove the foreign matter of dust and depressing image defects as is described above.

A second characteristic aspect of the systematizing techniques is a constitution of a thermal transfer apparatus.

A thermal transfer apparatus is used for conducting a step of transferring the image-receiving sheet on which an image has been printed in the recording apparatus to a printing regular paper (hereinafter referred to as "regular paper"). This step is absolutely the same as First Proof™. When the image-receiving sheet and the regular paper are superimposed one over the other, and heat and pressure are applied thereto, the two are adhered to each other. Subsequently, when the image-receiving film is peeled from the regular paper, only the image and the adhesive layer remain on the proper paper, with the image-receiving sheet support and the cushion layer being peeled off. Therefore, from the practical point of view, the image is transferred from the image-receiving sheet to the regular paper.

In First Proof™, the regular paper and the image-receiving sheet are superimposed one over the other on an aluminum-made guide plate and passed between heat rollers to conduct transfer. The aluminum guide plate is used for preventing deformation of the proper paper. However, application of this system to the B2 size system of the invention requires an aluminum guide plate of a size larger than B2, thus there arising a problem that the apparatus requires a large space for its installation. In the present system, there is employed a structure wherein the conveying path rotates 180 degrees so as to discharge on the inserting side without using the aluminum guide, and hence the space for its installation is made extremely compact (FIG. 3). However, since the aluminum guide plate was not used, there arose a problem that the regular paper was deformed. Specifically, a pair of the discharged regular paper and the image-receiving sheet curled with the image-receiving sheet inside, and rolled on the discharge support. It is an extremely difficult work to peel the image-receiving sheet apart from this rolled-up regular paper.

Thus, a technique for preventing the rolling up was devised utilizing the bimetal effect based on the difference in the degree of contraction between the regular paper and the image-receiving sheet and the ironing effect by the structure of winding around the heat roller. In the case of inserting the image-receiving sheet in the state of being superimposed on the proper paper as in the conventional case, thermal contraction of the image-receiving sheet in the inserting direction is larger than the thermal contraction of the regular paper, and hence the curling by the bimetal effect occurs with the upper side inside. Since this curling direction is the same as the direction of the ironing effect, there results a serious curling due to the synergistic effect. However, by inserting the image-receiving sheet in the state of being disposed under the regular paper, the direction of the curling by the bimetal effect is made downward, whereas the direction of the curling by the ironing effect is made upward, thus the two curlings being cancelled out and the problem being solved.

The sequence of transferring the regular paper is as follows (hereinafter referred to as "method for transferring regular paper to be employed in this system"). A thermal transfer apparatus 41 to be used in this method and shown in FIG. 3 is to be operated manually as is different from the recording apparatus.

1) First, the temperature of a heat roller 43 (100 to 110° C.) and the conveying speed upon transfer (not shown) are set by means of a dial (not shown) depending upon the kind of the regular paper 42.
2) Next, the image-receiving sheet 20 is placed on the insertion support with the image facing upward, followed by removing dust on the image by means of a destaticizing brush (not shown). A dust-free regular paper 42 is superimposed thereon. In this occasion, the size of the superimposed proper paper 42 is larger than the size of the underlying image-receiving film 20, and hence the position of the image-receiving sheet is not seen, which makes registering difficult. In order to improve this workability, marks 45 are provided on the insertion support 44 which marks respectively show the positions of placing the image-receiving sheet and the regular paper. The reason why the size of the regular paper is larger is to prevent the image-receiving sheet 20 from dislocating out of the regular paper 42 to stain the heat roller 43 with the image-receiving layer of the image-receiving sheet 20.
3) When the image-receiving sheet and the regular paper are inserted in a superimposed state into the inserting inlet, an inserting rollers 46 rotates to feed the two toward a heating roller 43.
4) When the tip of the proper plate reaches the position of the heating rollers 43, the heat rollers nip the two to initiate transfer. The heating rollers are heat-resistant silicone rubber rollers. The image-receiving sheet and the regular paper are adhered to each other here by applying thereto pressure and heat at the same time. In the downstream of the heat rollers is provided a guide 47 made of a heat-resistant sheet, and the pair of the image-receiving sheet and the regular paper is conveyed upward between the upper heat roller and the guide 47 with the heat being applied thereto and, at the position of peeling claw 48, the pair is stripped from the heat roller and is guided to the discharge outlet 50 along the guide plate 49.

5) The pair of the image-receiving sheet and the regular paper discharged from the discharge outlet 50 is discharged onto the insertion support as the two being adhered to each other. Subsequently, the image-receiving sheet 20 is manually peeled apart from the regular paper 42.

A second characteristic aspect of the systematizing techniques is a constitution of the system.

The above-described apparatuses are connected to a plate-making system to exhibit functions as a color proof. As such system, it is required to output from the proof a printed product having an image quality resembling that of a printed product outputted based on certain plate-making data as much as possible. Thus, a software is needed which serves to resemble color and half-tone dots of the proof to a printed product. Specific examples of such connection are introduced below.

In the case of taking a proof of a printed product from a plate-making system, called Celebra™ made by Fuji Photo Film Co., Ltd., system connection is as follows. Celebra is connected to a CTP (Computer To Plate) system. Final printed products can be obtained by loading a printing plate outputted from the system on a printing machine. To Celebra is connected the above-described recording apparatus, Luxel FINALPROOF 5600 (hereinafter also referred to as "FINALPROOF") made by Fuji Photo Film Co., Ltd. as a color proof, with a proof-driving software of PD system™ made by Fuji Photo Film Co., Ltd. intervening therebetween for resembling color and half-tone dots to the printed product.

The contone (continuous tone) data converted to raster data in Celebra are in turn converted to two-value data for half-tone dots and outputted to the CTP system, followed by final printing. On the other hand, the same contone data are also outputted to the PD system. The PD system converts the received data so that the colors coincide with that of the printed product by using at least 4 color tables. And, finally, the data are converted to two-value data for half-tone dots so as to coincide with the half-tone dots of the printed product, and outputted to FINALPROOF (FIG. 4).

The at least 4 color tables are previously prepared through experiments and stored within the system. The experiments are as follows. An image printed via the CTP system and an image outputted on FINALPROOF via the PD system are prepared and compared with each other with respect to important colors, followed by comparing the measured color values and preparing a table for minimizing the differences.

As has been described hereinbefore, the invention has successfully realized a system constitution permitting the material having a high resolving power to exhibit its full performance.

Next, the thermal transfer sheet, which is a material to be used in the system of the invention, is described below.

It is preferred that the difference between the surface roughness Rz of the surface of the image-forming layer of the thermal transfer sheet and the surface roughness Rz of the back surface layer thereof in terms of the absolute value is 3.0 μm or less, and that the difference between the surface roughness Rz of the surface of the image-receiving layer of the image-receiving sheet and the surface roughness Rz of the back surface layer thereof in terms of the absolute value is 3.0 μm or less. Such constitution enables to prevent image defects together with the above-described cleaning means, prevent conveying jam and improve dot gain stability.

The term "surface roughness" as used herein in this specification means a ten-point average surface roughness corresponding to Rz (maximum height) described in JIS, and is obtained by inputting to convert an average value of the five height values of the highest peak to the fifth highest peak and an average value of the five depth values of the deepest valley to the fifth deepest valley with taking the average level in the area selected as a standard portion from the rough surface as the standard level. For the measurement, a needle-tough type three dimensional roughness meter (Surfcom 570A-3DF) made by Tokyo Seimitsu K.K. The measuring direction is the longitudinal direction, with a cut-off value being 0.08 mm, a measuring area being 0.6 mm×0.4 mm, a feeding pitch being 0.005 mm, and a measuring speed being 0.12 mm/s.

It is more preferred in view of more enhancing the above-described effects that the difference between the surface roughness Rz of the surface of the image-forming layer of the thermal transfer sheet and the surface roughness Rz of the back surface layer thereof in terms of the absolute value is 1.0 μm or less, and that the difference between the surface roughness Rz of the surface of the image-receiving layer of the image-receiving sheet and the surface roughness Rz of the back surface layer thereof in terms of the absolute value is 1.0 μm or less.

Further, as another embodiment, the surface roughness of the surface of the image-forming layer of the thermal transfer sheet and that of the back surface layer thereof, and/or the surface roughness Rz of the surface and the back surface of the image-receiving sheet are preferably 2 to 30 μm. Such constitution serves, together with the cleaning means, to prevent image defects, remove conveying jam and improve dot gain stability.

Also, it is preferred that the glossiness of the image-forming layer of the thermal transfer sheet is 80 to 99.

The glossiness greatly depends upon smoothness of the surface of the image-forming layer, and can influence the uniformity of the thickness of the image-forming layer. A higher glossiness provides a more uniform image-forming layer which is more suited for the use of a highly accurate images, but a higher smoothness generates a larger resistance upon conveying, thus the two being in the trade-off relation. When the glossiness is within the range of 80 to 99, the two are compatible and well-balanced.

Next, mechanism of forming a multi-color image by thin film thermal transfer using a laser light is outlined below by reference to FIG. 1.

An image-receiving sheet 20 is superimposed on the surface of an image-forming layer 16 of a thermal transfer sheet 10, said image-forming layer 16 containing a pigment of black (K), cyan (C), magenta (M), yellow (Y) or the like to prepare a laminate 30 for forming an image. The thermal transfer sheet 10 comprises a support 12 having provided thereon a light-to-heat conversion layer 14 and the image-forming layer 16 in this order, and the image-receiving sheet 20 comprises a support 22 having provided thereon an image-receiving layer 24. The image-receiving sheet 20 is superimposed on the thermal transfer sheet 10 so that the surface of the image-forming layer 16 comes into contact with the image-receiving layer 24 (FIG. 1(*a*)). When a laser light is imagewise irradiated in time sequence from the side of the support 12 of the thermal transfer sheet 10, the light-to-heat conversion layer 14 of the thermal transfer sheet 10 generates heat in the laser light-irradiated area, resulting in reduction of adhesion force with the image-forming layer (FIG. 1(*b*)). Subsequently, when the image-receiving sheet 20 is peeled apart from the thermal transfer sheet 10, the laser light-irradiated area 16' of the image-forming layer 16 is transferred onto the image-receiving layer 24 of the image-receiving sheet 20 (FIG. 1(*c*)).

In forming a multi-color image, the laser light to be used is preferably a multi-beam light, particularly, a multi-beam of second dimension arrangement. The term "multi-beam of second dimension arrangement" as used herein means that spots of a plurality of laser beams are in a second dimension plane arrangement wherein a plurality of spots are arranged as rows in the main scanning direction and a plurality of spots are arranged as lines in the subsidiary scanning direction.

Use of a laser light of multi-beam second dimension arrangement permits to shorten the time required for laser recording.

The laser light to be used is not particularly limited, and there may be utilized direct laser lights such as a gas laser light, e.g., an argon ion laser light, a helium neon laser light or a helium cadmium laser light; a solid-state laser light, e.g., a YAG laser; a semi-conductor laser; a dye laser; and an eximer laser. Alternatively, lights generated by converting to lights of a half wavelength by passing these laser lights through a secondary high frequency element may be used as well. In the multi-color image-forming method, use of a semiconductor laser is preferred in consideration of output power and easiness of modulation. In the multi-color image-forming method, the laser light is irradiated preferably under such condition that the beam diameter on the light-to-heat conversion layer is in the range of from 5 to 50 μm (particularly from 6 to 30 μm), and the scanning rate is preferably lm/sec or more (particularly 3 m/sec or more).

Also, in view of forming a multi-color image, the thickness of the image-forming layer in the thermal transfer sheet for black is preferably more than the thickness of the image-forming layer in each of the thermal transfer sheets for yellow, magenta and cyan, and is preferably 0.5 to 0.7 μm. Such thickness serves to depress reduction in density due to uneven transfer upon irradiation of the black thermal transfer sheet with a laser light.

By adjusting the thickness of the image-forming layer in the thermal transfer sheet for black to be 0.5 μm or more, an enough image density is maintained with no uneven transfer, thus an image density required as a proof for printing being obtained. This tendency becomes more remarkable under a condition of a high humidity, and hence change in density due to change in environment can be depressed. On the other hand, by adjusting the thickness to be 0.7 μm or less, an enough transfer sensitivity can be maintained upon laser recording, and deposition of small dots or fine lines is also improved. This tendency becomes more remarkable under a condition of a low humidity. Also, resolving power can be improved. The thickness of the image-forming layer of the thermal transfer sheet for black is more preferably 0.55 to 0.65 μm, particularly preferably 0.60 μm.

Further, it is preferred that the thickness of the image-forming layer in the thermal transfer sheet for black is 0.5 to 7 μm, and the thickness of the image-forming layer in each of the thermal transfer sheets for yellow, magenta and cyan is 0.2 μm or more and less than 0.5 μm. By adjusting the thickness of the image-forming layer of each of the thermal transfer sheets of yellow, magenta and cyan to be 0.2 μm or more, an enough density is maintained with forming no transfer unevenness upon the laser recording whereas, by adjusting the thickness to be less than 0.5 μm, transfer sensitivity and resolving power can be improved. The thickness is more preferably 0.3 to 0.45 μm.

The image-forming layer in the thermal transfer sheet for black preferably contains carbon black. The carbon black preferably comprises at least two kinds of carbon black products different in coloring power, because such carbon black permits to adjust reflection density with keeping P/B (Pigment/Binder) ratio within a definite range. Coloring power of carbon black is expressed in terms of various means. For example, there is illustrated PVC black degree described in Japanese Patent Laid-Open No. 140033/1998. PVC black degree is a value obtained by adding a carbon black sample to a PVC resin, dispersing using a twin roll, forming into a sheet, and visually evaluating the black degree of the sample, taking the black degree of carbon black "#40" and that of carbon black "#45" made by Mitsubishi Chemical Co., Ltd. as scores of 1 and 10, respectively, as standard values. It is possible to appropriately select two kinds or more carbon black products different in the PVC black degree depending upon the end-use.

A process for preparing a sample is specifically described below.

[Process for Preparing a Sample]

A carbon black sample is compounded in a content of 40% by weight in an LDPE resin (Low-Density PolyEthylene) in a 250-cc Bumbury's mixer, followed by kneading at 115° C. for 4 minutes.

| Compounding conditions: | |
|---|---|
| LDPE resin | 101.89 g |
| Calcium stearate | 1.39 g |
| Irganox 1010 | 0.87 g |
| carbon black sample | 69.43 g |

Next, the mixture is diluted at 120° C. in a twin-roll mill to a carbon black concentration of 1% by weight. Conditions for preparing the diluted compound:

| | |
|---|---|
| LDPE resin | 58.3 g |
| Calcium stearate | 0.2 g |
| Resin containing carbon black in a content of 40% by weight | 1.5 g |

The resulting compound is made into a sheet through a slit of 0.3 mm in slit gap, and this sheet is cut into chips, and formed into a film of 65±3 μm in thickness on a 240° C. hot plate.

As a method for forming a multi-color image, a number of image layers (image-forming layers wherein an image has been formed) may be repeatedly superimposed on the same image-receiving sheet using the thermal transfer sheets as described hereinbefore to form a multi-color image, or an image may once be formed on an image-receiving layer of each of a plurality of image-receiving sheets, followed by re-transferring onto a regular paper for printing to form a multi-color image.

As to the latter method, thermal transfer sheets each having an image-forming layer containing a coloring material with a different hue from other sheet are prepared, and independent 4 or more (for example, cyan, magenta, yellow, black, red, etc.) of layered products for forming an image wherein each of the thermal transfer sheets is combined with an image-receiving sheet are prepared. Each of the layered products is irradiated with a laser light according to digital signals based on the image through a color separation filter and, subsequently, the heat transfer sheet is peeled apart from the image-receiving sheet to independently form a color separation image of each color on each of the image-receiving sheets. Next, each of the color separation images thus formed is successively superimposed on a separately prepared actual support such as regular paper for printing or a support similar thereto to form a multi-color image.

The thermal transfer sheets to be irradiated with a laser light are preferably those which can convert a laser beam to heat, the energy of which is utilized to form an image on an image-receiving sheet by the thin film transfer method of transferring a pigment-containing image-forming layer onto the image-receiving sheet. The techniques employed for the development of an image-forming material comprising the thermal transfer sheets and an image-receiving sheet may properly be applied to development of thermal transfer sheets and/or an image-receiving sheet based on the melt-transfer method, the abrasion transfer method or the sublimation transfer method. The system of the invention encompasses an image-forming materials for use in these methods.

The thermal transfer sheet and the image-receiving sheet are described in detail below.

[Thermal Transfer Sheet]

The thermal transfer sheet comprises a support having provided thereon at least a light-to-heat conversion layer, an image-forming layer and, if necessary, other layer or layers.

(Support)

The material for the support of the thermal transfer sheet is not particularly limited, and various materials for the support may be used depending upon the end-use. As the support, those which have a good dimensional stability and can resist heat upon image formation are preferred. As the preferred examples of the material for the support, there are illustrated synthetic resin materials such as polyethylene terephthalate, polyethylene 2,6-naphthalate, polycarbonate, polymethyl methacrylate, polyethylene, polypropylene, polyvinyl chloride, polyvinylidene chloride, polystyrene, styrene-acrylonitrile copolymer, polyamide (aromatic or aliphatic), polyimide, polyamidimide, polysulfone, etc. Among them, biaxially oriented polyethylene terephthalate is preferred in consideration of mechanical strength or dimensional stability for heat. Additionally, in the case of using for preparing a color proof utilizing the laser recording, the support for the thermal transfer sheet is preferably formed from a transparent synthetic resin material which can transmit a laser light. The thickness of the support is preferably 25 to 130 μm, particularly preferably 50 to 120 μm. The center-line average surface roughness Ra (measured based on JIS B0601 using, for example, Surfcom made by Tokyo Seimitsu K.K.) of the support on the image-forming layer side is preferably less than 0.1 μm. The Young's modulus of the support in the longitudinal direction is preferably 200 to 1200 $Kg/mm^2$ (≈0.2 to 12 GPa), and the young's modulus in the transverse direction is preferably 250 to 1600 $Kg/mm^2$ (≈2.5 to 16 GPa). The F-5 value of the support in the longitudinal direction is preferably 5 to 50 $Kg/mm^2$ (≈49 to 490 MPa), and the F-5 value of the support in the transverse direction is preferably 3 to 30 $Kg/mm^2$ (≈29.4 to 294 MPa). The F-5 value of the support in the longitudinal direction is generally higher than the F-5 value of the support in the transverse direction, though not being limited so in the case where the strength in the transverse direction is required to be higher. The heat-shrinking ratio of the support in the longitudinal direction and the transverse direction at 100° C. for 30 minutes is preferably 3% or less, more preferably 1.5% or less, and the heat-shrinking ratio at 80° C. for 30 minutes is preferably 1% or less, more preferably 0.5% or less. The breaking strength in both directions is preferably 5 to 100 Kg/mm2 (=0.49 to 980 MPa), and the elasticity modulus is preferably 100 to 2000 Kg/mm2 (≈0.98 to 19.6 GPa).

In order to improve adhesion to the light-to-heat conversion layer to be provided on the support of the thermal transfer sheet, the support may be subjected to a surface-activating treatment, and/or one, two or more undercoating layers may be provided on the support. Examples of the surface-activating treatment include a glow discharge treatment and a corona discharge treatment. As the material for the undercoating layer, those which show high adhesion properties to both the surface of the support and the surface of the light-to-heat conversion layer, and which have a small heat conductivity and an excellent heat resistance are preferred. Examples of such materials for the undercoating layer include styrene, styrene-butadiene copolymer and gelatin. The thickness of the whole undercoating layers is usually 0.01 to 2 μm. Also, on the surface opposite to the side on which the light-to-heat conversion layer of the thermal transfer sheet is provided may be provided, as needed, various functional layers such as an anti-reflecting layer or an antistatic layer, or the surface may be subjected to surface treatment.

(Backing Layer)

It is preferred to provide a backing layer on the surface opposite to the side on which the light-to-heat conversion layer of the thermal transfer sheet of the invention is provided. The backing layer is preferably constituted by a first backing layer provided adjacent to the support and a second backing layer provided on the opposite side of this first backing layer to the support. In the invention, the ratio of the weight A of an antistatic agent contained in the first backing layer to the weight B of an antistatic agent contained in the second backing layer, B/A, is preferably less than 0.3. In case when B/A is 0.3 or more, there results a tendency of the sliding properties and dust dropping of the backing layer becoming serious.

The thickness of the first backing layer, C, is preferably 0.01 to 1 μm, more preferably 0.01 to 0.2 μm. Also, the thickness of the second backing layer, D, is preferably 0.01 to 1 μm, more preferably 0.01 to 0.2 μm. The ratio of the thickness of the first backing layer and the thickness of the second backing layer, C:D, is preferably 1:2 to 5:1.

As the antistatic agents to be used in the first and the second backing layers, there may be used nonionic surfactants such as polyoxyethylenealkylamine and glycerin fatty acid ester, cationic surfactants such as quaternary ammonium salt, anionic surfactants such as alkylphosphate, amphoteric surfactants and electroconductive resins.

Also, conductive fine particles may be used as the antistatic agent. Examples of such conductive fine particles include oxides such as ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfides such as CuS and ZnS; carbides such as SiC, TiC, ZrC, VC, NbC, MoC and WC; nitrides such as $Si_3N_4$, TiN, ZrN, VN, NbN and $Cr_2N$; borides such as $TiB_2$, $ZrB_2$, $NbB_2$, $TaB_2$, CrB, MoB, WB and $LaB_5$; silicides such as $TiSi_2$, $ZrSi_2$, $NbSi_2$, $TaSi_2$, $CrSi_2$, $MoSi_2$ and $WSi_2$; metal salts such as $BaCO_3$, $CaCO_3$, $SrCO_3$, $BaSO_4$ and $CaSO_4$; and composites such as $SiN_4$—SiC and $9Al_2O_3$—$2B_2O_3$. These may be used independently or in combination of two or more of them. Of these, $SnO_2$, ZnO, $Al_2O_3$, $TiO_2$, $In_2O_3$, MgO, BaO and $MoO_3$ are preferred, with $SnO_2$, ZnO, $In_2O_3$ and $TiO_2$ being more preferred, and $SnO_2$ being particularly preferred.

Additionally, in the case of using the thermal transfer material of the invention for the laser thermal transfer recording system, the antistatic agent to be used in the backing layer is preferably substantially transparent so as to permit transmission of a laser light.

In the case of using the conductive metal oxide as an antistatic agent, the smaller the particle size thereof, the more preferred, for the purpose of minimizing scattering of the laser light. However, the particle size should be determined using the ratio of refractive index of the particles to that of the binder as a parameter. In general, the average particle size is in the range of from 0.001 to 0.5 μm, preferably from 0.003 to 0.2 μm. The term "average particle size" as used herein means the value for not only the particle size of primary particles of the conductive metal oxide but the particle size of higher structure particles.

To the first and the second backing layers may be added various additives such as a surfactant, a slipping agent and a matting agent and a binder in addition to the antistatic agent. The amount of the antistatic agent to be incorporated in the first backing layer is preferably 10 to 1000 parts by weight, more preferably 200 to 800 parts by weight, per 100 parts by weight of the binder. Also, the amount of the antistatic agent to be contained in the second backing layer is preferably 0 to 300 parts by weight, more preferably 0 to 100 parts by weight, per 100 parts by weight of the binder.

As the binder to be used for forming the first and the second backing layers, there may be illustrated, for example, homopolymers and copolymers of acrylic monomers such as acrylic acid, methacrylic acid, an acrylic ester and an methacrylic ester; cellulose series polymers such as nitrocellulose, methyl cellulose, ethyl cellulose and cellulose acetate; polyvinyl polymers and copolymers of a vinyl compound such as polyethylene, polypropylene, polystyrene, a vinyl chloride copolymer, a vinyl chloride-vinyl acetate copolymer, polyvinylpyrrolidone, polyvinyl butyral and polyvinyl alcohol; condensation polymers such as a polyester, a polyurethane and a polyamide; rubber type thermoplastic polymers such as a butadiene-styrene copolymer; polymers obtained by polymerizing and cross-linking a photo-polymerizable or thermo-polymerizable compound such as an epoxy compound; and a melamine compound.

(Light-to-Heat Conversion Layer)

The light-to-heat conversion layer contains a light-to-heat converting substance, a binder and, if necessary, a matting agent and, further, other ingredients.

The light-to-heat converting substance is a substance which has a function of converting the irradiated light energy to a heat energy. In general, it is a coloring material (including a pigment; hereinafter the same) which can absorb a laser light. In the case of conducting image recording by an infrared ray laser, it is preferred to use an infrared ray-absorbing coloring material as the light-to-heat converting substance. Examples of the coloring material include black pigments such as carbon black; pigments of large ring compounds showing an absorption in the range of from the visible region to near-infrared region such as phthalocyanine and naphthalocyanine; organic dyes (such as cyanine dyes, e.g., indolenine dyes; anthraquinone series dyes; azulene series dyes; and phthalocyanine dyes) used as a laser light-absorbing substance for high-density laser recording such as photo-discs; and organometallic compound coloring materials such as a dithiol-nickel complex. Especially, the cyanine series coloring materials are preferred, since they show such a high absorbancy index for a light of infrared region that, when used as a light-to-heat converting substance, they serve to reduce the thickness of the light-to-heat conversion layer, leading to more improving the recording sensitivity of the thermal transfer sheet.

As the light-to-heat converting substance, inorganic substances such as particulate metal substances such as blackened silver may be used other than the coloring materials.

As a binder to be contained in the light-to-heat conversion layer, those resins are preferred which have a strength of at least forming a layer on a support and have a high thermal conductivity. Further, those resins which are heat-resistance and are not decomposed even by heat generated from the light-to-heat converting substance upon image recording are preferred because, even when the light irradiation is conducted with a high energy, the light-to-heat conversion layer can maintain the smoothness of its surface after irradiation with a light. Specifically, those resins are preferred which show a thermal decomposition temperature (a temperature at which the resin loses 5% weight thereof in an air stream at a temperature-raising rate of 10 C/min according to TGA (thermogravimetric analysis) method) of 400° C. or higher, more preferably 500° C. or higher. Also, the binder has a glass transition temperature of preferably 200 to 400° C., more preferably 250 to 350° C. In case where the glass transition temperature is lower than 200° C., the resulting image can generate fog in some cases whereas, in case where higher than 400° C., solubility of the resin is so reduced that, in some cases, production efficiency is lowered.

Additionally, heat resistance of the binder for the light-to-heat conversion layer (for example, heat deformation temperature or thermal decomposition temperature) is preferably higher than that of those materials to be used for other layers to be provided on the light-to-heat conversion layer.

Specifically, there are illustrated acrylic acid-based resins such as polymethyl methacrylate; polycarbonate; polystyrene; vinyl resins such as vinyl chloride/vinyl acetate copolymer and polyvinyl alcohol; polyvinyl butyral; polyester; polyvinyl chloride; polyamide; polyimide; polyetherimide; polysulfone; polyether sulfone; aramide; polyurethane; epoxy resin; and urea/melamine resin. Of these, the polyimide resin is preferred.

Particularly, the polyimide resins represented by the following general formulae (I) to (VII) are preferred, because they are soluble in an organic solvent, and use of these polyimide resins serves to improve productivity of the thermal transfer sheets. Also, they are preferred in the point that they improve viscosity stability, long-time preservability and humidity resistance of a coating solution for the light-to-heat conversion layer.

(I)

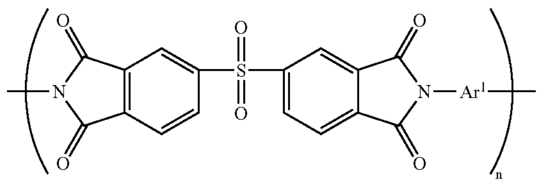

-continued
(II)
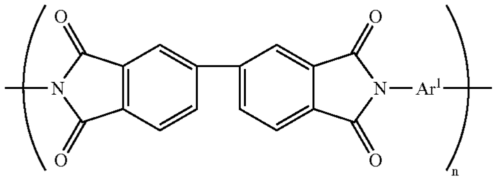
In the above general formulae (I) and (II), Ar represents an aromatic group represented by the following structural formulae (1) to (3), and n represents an integer of 10 to 100.
(1)
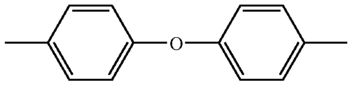
(2)
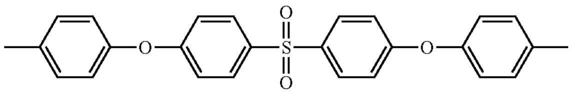
-continued
(3)
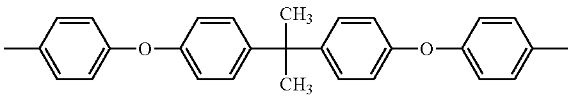
(III)
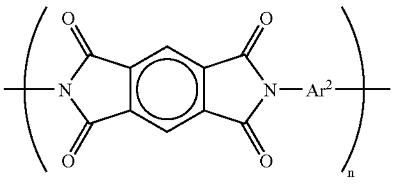
(IV)
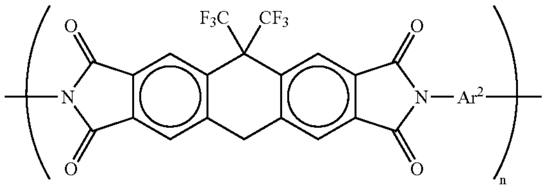
In the above general formulae (III) and (IV), $Ar^2$ represents an aromatic group represented by the following structural formulae (4) to (7), and n represents an integer of 10 to 100.
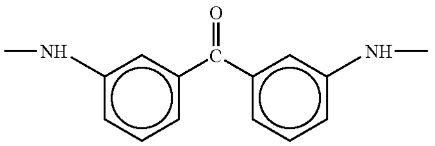
(4)
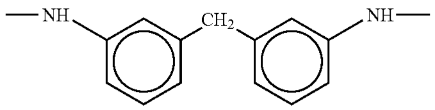
(5)
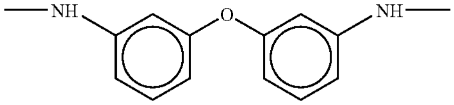
(6)
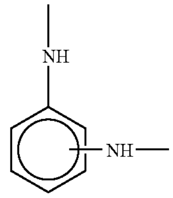
(7)
(V)
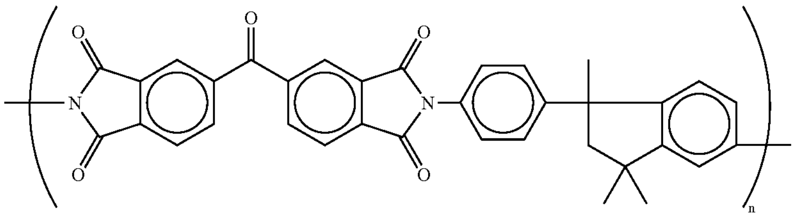
(VI)
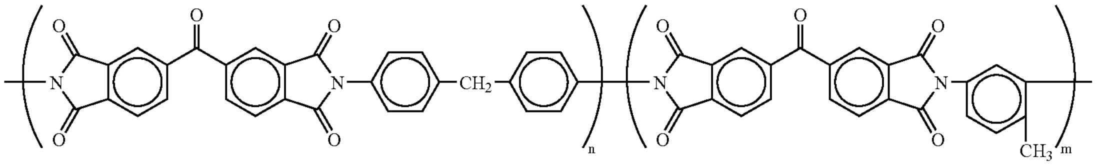

-continued (VII)

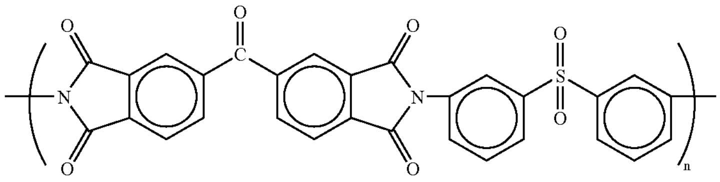

In the above general formulae (V) to (VII), n and m each represents an integer of 10 to 100. In the formula (VI), the ratio of n:m is 6:4 to 9:1.

Additionally, as a standard for judging whether a resin is soluble in an organic solvent or not, the resin is judged to be soluble in an organic solvent when 10 parts by weight or more of the resin is soluble in 100 parts by weight of N-methylpyrrolidone. A resin which is soluble in an amount of 10 parts by weight or more is preferably used as a resin for the light-to-heat conversion layer. Amore preferred resin is that which is soluble in an amount of 100 parts by weight or more in 100 parts by weight of N-methylpyrrolidone.

As a matting agent to be contained in the light-to-heat conversion layer, there may be illustrated inorganic fine particles and organic fine particles. Examples of the inorganic particles include silica, titanium oxide, aluminum oxide, zinc oxide, magnesium oxide, metal salts such as barium sulfate, magnesium sulfate, aluminum hydroxide, magnesium hydroxide, boron nitride, etc., kaolin, clay, talc, zinc flower, lead white, zeeklite, quarts, diatomaceous earth, barlite, bentonite, mica, synthetic mica, etc. Examples of the organic fine particles include resin particles such as fluorine-containing resin particles, guanamine resin particles, acryl resin particles, styrene-acryl copolymer resin particles, silicone resin particles, melamine resin particles, epoxy resin particles, etc.

The particle size of the matting agent is usually 0.3 to 30 μm, preferably 0.5 to 20 μm, and the amount thereof is preferably 0.1 to 100 $mg/m^2$.

To the light-to-heat conversion layer may further be added, as needed, a surfactant, a thickening agent, an antistatic agent, etc.

The light-to-heat conversion layer can be provided by dissolving a light-to-heat converting substance and a binder and, if necessary, a matting agent and other ingredients to prepare a coating solution, and coating it on a support, followed by drying. Examples of the organic solvent for dissolving a polyimide resin include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethylsulfoxide, dimethylformamide, dimethylacetamide, γ-butyrolactone, ethanol, methanol, etc. The coating and drying procedures are preferably conducted by utilizing common coating and drying methods. In the case of using polyethylene terephthalate as a support, it is preferred to conduct drying at a temperature of 80 to 150° C.

When the amount of the binder in the light-to-heat conversion layer is too small, cohesive force of the light-to-heat conversion layer decreases and, when a formed image is transferred to the image-receiving sheet, the light-to-heat conversion layer is liable to be transferred thereto as well, thus causing color mixing of the image. Also, when the amount of the polyimide resin is too much, the light-to-heat conversion layer needs to be made thicker in order to achieve a necessary definite light absorption ratio. This is liable to cause a deterioration of sensitivity. The solid component ratio by weight of the light-to-heat converting substance and the binder in the light-to-heat conversion layer is preferably 1:20 to 2:1, more preferably 1:10 to 2:1.

Also, reduction in thickness of the light-to-heat conversion layer enables to make the thermal transfer sheet more sensitive, thus being preferred. The thickness of the light-to-heat conversion layer is preferably 0.03 to 1.0 μm, more preferably 0.05 to 0.5 μm. Also, when the light-to-heat conversion layer shows an optical density of 0.80 to 1.26 for a light of 808 nm in wavelength, it can improve transfer sensitivity of the image-forming layer, thus being preferred. A light-to-heat conversion layer showing the optical density of 0.92 to 1.15 for the light of the above-described wavelength is more preferred. In case when the optical density in the laser peak wave length is less than 0.80, it becomes insufficient to convert the irradiated light to heat and, in some cases, there results a reduced transfer sensitivity. On the other hand, when exceeding 1.26, functions of the light-to-heat conversion layer are affected to generate fog in some cases.

(Image-Forming Layer)

The image-forming layer contains at least a pigment to be transferred to the image-receiving layer to form an image, and further contains a binder for forming a layer and, if necessary, other components.

The pigments are generally roughly grouped into organic pigments and inorganic pigments. The former are particularly excellent in transparency of the coating film, whereas the latter are generally excellent in opacifying power, and hence it suffices to select a proper one depending upon the use. In the case of using the thermal transfer sheet for proofing printed colors, organic pigments are preferably used which have the same color tones as commonly used colors such as yellow, magenta, cyan, black, red, green, blue, orange, etc. or have a color similar thereto. In addition, in some cases, there may be used metal powders and fluorescent pigments. Examples of the pigments to be preferably used include azo pigments, phthalocyanine pigments, anthraquinone pigments, dioxazine pigments, quinacridone pigments, isoindolinone pigments and nitro pigments. Pigments to be used in the image-forming layer are illustrated below according to hue, which, however, are not limitative at all.

1) Yellow Pigments:

Pigment Yellow 12 (C.I. No. 21090)

Examples) Permanent Yellow DHG (made by Clariant Japan K.K.), Lionol Yellow 1212B (made by Toyo Ink Mfg. Co., Ltd.), Irgalite Yellow LCT (made by Ciba Specialty Chemicals, Ltd.), Symuler Fast Yellow GTF 219 (made by Dai-Nippon Ink & Chemicals, Inc.)

Pigment Yellow 13 (C.I. No. 21100)

Examples) Permanent Yellow GR (made by Clariant Japan K.K.), Lionol Yellow 1313 (made by Toyo Ink Mfg. Co., Ltd.)

Pigment Yellow 14 (C.I. No. 21095)

Examples) Permanent Yellow G (made by Clariant Japan K.K.), Lionol Yellow 1401-G (made by Toyo Ink Mfg. Co., Ltd.), Seika Fast Yellow 2270 (made by Dainichi Seika Kogyo K.K.), Symuler Fast Yellow 4400 (made by Dai-nippon Ink & Chemicals, Inc.

Pigment Yellow 17 (C.I. No. 21105)

Examples) Permanent Yellow GG02 (made by Clariant Japan K.K.), Symuler Fast Yellow 8GF (made by Dai-nippon Ink & Chemicals, Inc.

Pigment Yellow 155

Examples) Graphtol Yellow 3GP (made by Clariant Japan K.K.)

Pigment Yellow 180 (C.I. No. 21290)

Examples) Novoperm Yellow P-HG (made by Clariant Japan K.K.) PV Fast Yellow HG (made by Clariant Japan K.K.)

Pigment Yellow 139 (C.I. No. 56298)

Examples) Novoperm Yellow M2R 70 (made by Clariant Japan K.K.)

2) Magenta Pigments

Pigment Red 57:1 (C.I. No. 15850:1)

Examples) Graphtol Rubine L6B (made by Clariant Japan K.K.), Lionol Red 6B-4290G (made by Toyo Ink Mfg. Co., Ltd.), Irgalite Rubine 4BL (Ciba Specialty Chemicals K.K.), Symuler Brilliant Carmine 6B-229 (made by Dai-nippon Ink & Chemicals, Inc.)

Pigment Red 122 (C.I. No. 73915)

Examples) Hosterperm Pink E (made by Clariant Japan K.K.), Lionogen Magenta 5790 (made by Toyo Ink mfg. Co., Ltd.), Fastogen Super Magenta RH (made by Dai-nippon Ink & Chemicals, Inc.)

Pigment Red 53:1 (C.I. No. 15585:1)

Examples) Permanent Lake Red LCY (made by Clariant Japan K.K.), Symuler Lake Red C conc (made by Dai-nippon Ink & Chemicals, Inc.)

Pigment Red 48:2 (C.I. No. 15865:2)

Examples) Permanent Red W2T (made by Clariant Japan K.K.), Lionol Red LX235 (made by Toyo Ink Mfg. Co., Ltd.), Symuler Red 3012 (made by Dai-nippon Ink & Chemicals, Inc.)

Pigment Red 177 (C.I. No. 65300)

Examples) Cromophtal Red A2B (made by Ciba Specialty Chemicals K.K.)

3) Cyan Pigments

Pigment Blue 15 (C.I. No. 74160)

Examples) Lionol Blue 7027 (made by Toyo Ink Mfg. Co., Ltd.) Fastogen Blue BB (made by Dai-nippon Ink & Chemicals, Inc.)

Pigment Blue 15:1 (C.I. No. 74160)

Examples) Hosterperm Blue A2R (made by Clariant Japan K.K.), Fastogen Blue 5050 (made by Dai-nippon Ink & Chemicals, Inc.)

Pigment Blue 15:2 (C.I. No. 74160)

Examples) Hosterperm Blue AFL (made by Clariant Japan K.K.), Irgalite Blue BSP (made by Ciba Specialty Chemicals K.K.), Fastogen Blue GP (made by Dai-nippon Ink & Chemicals, Inc.)

Pigment Blue 15:3 (C.I. No. 74160)

Examples) Hosterperm Blue B2G (made by Clariant Japan K.K.), Lionol Blue FG7330 (made by Toyo Ink Mfg. Co., Ltd.), Cromophtal Blue 4GNP (Ciba Specialty Chemicals K.K.), Fastogen Blue FGF (Dai-nippon Ink & Chemicals, Inc.)

Pigment Blue 15:4 (C.I. No. 74160)

Examples) Hosterperm Blue BFL (Clariant Japan K.K.), Cyanine Blue 700–10FG (made by Toyo Ink Mfg. Co., Ltd.), Irgalite Blue GLNF (made by Ciba Specialty Chemicals K.K.), Gastogen Blue FGS (Dai-nippon Ink & Chemicals, Inc.)

4) Black Pigments

Pigment Black 7 (carbon black C.I. No. 77266)

Examples) Mitsubishi Carbon Black MA100 (made by Mitsubishi Chemical Co., Ltd.), Mitsubishi Carbon Black #5 (made by Mitsubishi Chemical Co., Ltd.), Black Pearls 430 (made by Cabot Co.)

5) Red Pigments

Pigment Red 48:1 (C.I. No. 15865:1)

Examples) Lionol Red 2B-FG3300 (made by Toyo Ink Mfg. Co., Ltd.), Symuler Red NRY, Symuler Red 3108 (made by Dai-nippon Ink & Chemicals, Inc.)

Pigment Red 48:3 (C.I. No. 15865:3)

Examples) Permanent Red 3RL (made by Clariant Japan K.K.), Symuler Red 2BS (made by Dai-nippon Ink & Chemicals, Inc.)

6) Blue Pigments

Pigment Blue 15:6 (C.I. No. 74160)

Example) Lionol Blue ES (Toyo Ink Mfg. Co., Ltd.)

Pigment Blue 60 (C.I. No. 69800)

Examples) Hosterperm Blue RL01 (made by Clariant Japan K.K.), Lionolgen Blue 6501 (made by Toyo Ink Mfg. Co., Ltd.)

7) Green Pigments

Pigment Green 7 (C.I. No. 74260) Example) Fastogen Green S (made by Dai-nippon Ink & Chemicals, Inc.)

8) Orange Pigments

Pigment Orange 43 (C.I. No. 71105) Example) Hosterperm Orange GR (made by Clariant Japan K.K.)

Also, as pigments to be used in the invention, proper products may be selected by reference to “GanryoBinran” compiled by Nihon Ganryo Gijutsu Kyokai, and published by Seibundo Sinkosha in 1989, “COLOR INDEX, THE SOCIETY OF DYES & COLOURIST, THIRD EDITION, 1987”, etc.

The average particle size of the pigments is preferably 0.03 to 1 μm, more preferably 0.05 to 0.5 μm.

Particles having a particle size of 0.03 μm or larger do not require a higher dispersing cost and do not cause gelation of a resulting dispersion, whereas particles having a particle size of 1 μm or smaller provide a good adhesion between the image-forming layer and the image-receiving layer owing to the absence of coarse particles and can improve transparency of the image-forming layer.

As the binder for the image-forming layer, amorphous organic high molecular polymers of 40 to 150° C. in softening point are preferred. As the amorphous organic high molecular polymers, there may be used, for example, a butyral resin, a polyamide resin, a polyethylene imine resin, a sulfonamide resin, a polyester polyol resin, a petroleum resin, homopolymers or copolymers of styrene, its derivative or substituted styrene such as styrene, vinyltoluene, α-methylstyrene, 2-methylstyrene, chlorostyrene, vinylbenzoic acid, sodium vinylbenzoate or aminostyrene, homopolymers of vinyl monomers such as methacrylates (e.g., methyl methacrylate, ethyl methacrylate, butyl methacrylate and hydroxyethyl methacrylate), methacrylic acid, acrylates (e.g., methyl acrylate, ethyl acrylate, butyl acrylate and α-ethylhexyl acrylate), acrylic acid, dienes such as butadiene and isoprene, acrylonitrile, vinyl ethers, maleic acid and maleic acid ester, maleic anhydride, cinnamic acid, vinyl chloride and vinyl acetate or copolymers thereof with other monomers. These resins may be used as a mixture of two or more of them.

The image-forming layer contains the pigment in an amount of preferably 30 to 70% by weight, more preferably 30 to 50% by weight. Also, the image-forming layer contains the resin in an amount of preferably 70 to 30% by weight, more preferably 70 to 40% by weight.

The image-forming layer may contain the following ingredients (1) to (3) as the aforesaid other ingredients.

(1) Waxes

Waxes include mineral waxes, natural waxes and synthetic waxes. Examples of the mineral waxes include petroleum waxes such s paraffin wax, microcrystalline wax, ester wax, oxidized wax, etc., montan wax, ozokerite, ceresin and the like. Among these, paraffin wax is preferred. The paraffin wax is a product separated from petroleum and, depending upon melting point, various kinds of paraffin waxes are commercially available.

Examples of the natural waxes include vegetable waxes such as carnauba wax, Japan wax, ouricury wax, and espal wax and animal waxes such as beeswax, insect wax, shellac wax and spermaceti.

The synthetic waxes are used generally as lubricants, and are usually composed of higher fatty acid compounds. Examples of such synthetic waxes include the following:

1) Fatty Acid-Based Waxes

Straight-chain saturated fatty acids represented by the following general formula:

$$CH_3(CH_2)_nCOOH$$

wherein n represents an integer of 6 to 28 are illustrated. Specific examples thereof include stearic acid, behenic acid, palmitic acid, 12-hydroxystearic acid, azelaic acid, etc.

Also, there are illustrated metal salts (e.g., K, Ca, Zn, Mg, etc.) of the above-described fatty acids.

2) Fatty Acid Ester-Based Waxes

Specific examples of the fatty acid esters include ethyl stearate, lauryl stearate, ethyl behenate, hexyl behenate, behenyl myristate, etc.

3) Fatty Acid Amide-Based Waxes

Examples of the fatty acid amides include stearic amide, lauric amide, etc.

4) Aliphatic Alcohol-Based Waxes

Straight-chain saturated aliphatic alcohols represented by the following general formula:

$$CH_3(CH_2)_nOH$$

wherein n represents an integer of 6 to 28 are illustrated. Specific examples thereof include stearyl alcohol, etc.

Among the synthetic waxes described in 1) to 4) above, higher fatty acid amides such as stearic amide and lauric amide are particularly suitable. Additionally, the above-mentioned wax compounds may be used singly or in a suitable combination thereof as required.

(2) Plasticizer

The plasticizer is preferably an ester compound, and mention can be made of known plasticizer, for example, phthalates such as dibutyl phthalate, di-n-octyl phthalate, di(2-ethylhexyl) phthalate, dinonyl phthalate, dilauryl phthalate, butyl lauryl phthalate and butyl benzyl phthalate; aliphatic dibasic acid esters such as di(2-ethylhexyl) adipate and di(2-ethylhexyl) sebacate; phosphoric acid triesters such as tricresyl phosphate and tri(2-ethylhexyl) phosphate; polyol polyesters such as polyethylene glycol; epoxy compounds such as epoxy fatty acid ester; and the like. Of these, esters of vinyl monomers, particularly esters of acrylic acid or methacrylic acid, are preferred in respect of improvement of transfer sensitivity and alleviating transfer unevenness, and of greater effect of regulating breaking elongation.

Examples of the acrylic or methacrylic ester compounds include polyethylene glycol dimethacrylate, 1,2,4-butanetriol trimethacrylate, trimethylolethane triacrylate, pentaerythritol acrylate, pentaerythritol tetraacrylate, dipentaerythritol polyacrylate, etc.

Also, the plasticizers may be high polymers, among which polyesters are preferred in respect of greater effect by the addition and resistance to diffusion under storage conditions. Examples of the polyesters include sebacic acid-based polyesters and adipic acid-based polyesters.

Additionally, the additives to be contained in the image-forming layer are not limited to these. Also, the plasticizers may be used alone or in combination of two or more of them.

In case when the content of the additives in the image-forming layer is too high, resolution of the transfer image may be lowered, film strength of the image-forming layer itself maybe lowered, and transfer to the image-receiving sheet may occur at non-irradiated portions due to a reduction in adhesion between the light-to-heat conversion layer and the image-forming layer. In view of the foregoing, the content of the wax is preferably 0.1 to 30% by weight, more preferably 1 to 20% by weight, based on the total solid content of the image-forming layer. Also, the content of the plasticizer is preferably 0.1 to 20% by weight, more preferably 0.1 to 10% by weight, based on the total solid content of the image-forming layer.

(3) Others

The image-forming layer may further contain surfactants, inorganic or organic fine particles (metal powder, silica gel, etc.), oils (linseed oil, mineral oil, etc.), thickening agents, antistatic agents, etc. in addition to the components described above. Except for cases where a black image is to be obtained, the energy necessary for transfer can be reduced by incorporation of a material that absorbs at the wavelength of a light source to be used for recording an image. The material that absorbs at the wavelength of the light source may be a pigment or a dye. In the case of obtaining a color image, it is preferred in view of color reproduction that an infrared light source such as a semiconductor laser or the like is used for recording the image, and a dye having considerable absorption at the wavelength of the light source and less absorption in the visible region is used as the material. Examples of near infrared dyes include compounds described in Japanese Patent Laid-Open No. 103476/1991.

The image-forming layer can be provided by preparing a coating solution containing dissolved or dispersed therein the pigment, the binder and the like, coating it on the light-to-heat conversion layer (or, in the case where a heat-sensitive release layer is provided on the light-to-heat conversion layer, coating the coating solution on the heat-sensitive release layer), and drying. Examples of a solvent to be used for preparing the coating solution include n-propyl alcohol, methyl ethyl ketone, propylene glycol monomethyl ether (MFG), methanol, water, etc. The coating and drying can be conducted utilizing a common coating and drying method.

It is possible to provide, on the light-to-heat conversion layer of the thermal transfer sheet, a heat-sensitive release layer containing a heat-sensitive material which generates gas or releases adhesion water by the action of heat generated in the light-to-heat conversion layer, and which thus weakens the adhesion force between the light-to-heat conversion layer and the image-forming layer. As the heat-sensitive materials, there may be used a compound (a polymer or a low molecular compound) which itself is decomposed or denatured by heat to generate a gas, a compound (a polymer or a low molecular compound) which has absorbed or adsorbed a large amount of an easily vaporizing gas such as moisture, and the like. These may be used in combination.

Examples of the polymer capable of generating a gas upon being decomposed or denatured include: auto-oxidizable polymers such as nitrocellulose; halogen-containing polymers such as chlorinated polyolefin, chlorinated rubber, polychlorinated rubber, polyvinylidene chloride, etc.; acrylic polymers such as polyisobutyl methacrylate, on which a volatile compound such as water is adsorbed; cellulose esters such as ethyl cellulose, on which a volatile compound such as water is adsorbed; and natural high polymer compounds such as gelatin, on which a volatile compound such as water is adsorbed. Examples of the low molecular compound capable of generating a gas upon being decomposed or denatured include compounds such as diazo compounds and azide compounds which can be decomposed by heat to generate a gas.

Additionally, such decomposition or denaturing of the heat-sensitive material by heat occurs at a temperature of preferably 280° C. or lower, particularly preferably 230 C or lower.

In a case where a low molecular compound is used as the heat-sensitive material, it is desirable that the low molecular compound is used in combination with a binder. As the binder, the above-mentioned polymer which itself is decomposed or denatured by heat to generate a gas may be used. Also, those ordinary binders which do not have such characteristics may be used. In the case of using the heat-sensitive low molecular compound and the binder in combination, the weight ratio of the former to the latter is preferably in a range of 0.02:1 to 3:1, more preferably 0.05:1 to 2:1. The heat-sensitive release layer preferably covers almost all over the surface of the light-to-heat conversion layer, and has a thickness of generally 0.03 to 1 μm, preferably 0.05 to 0.5 μm.

With a thermal transfer sheet which comprises a support having provided thereon the light-to-heat conversion layer, the heat-sensitive release layer and the image-forming layer in this order, the light-sensitive release layer is decomposed or denatured by heat conducted from the light-to-heat conversion layer to thereby generate a gas. Then, due to this decomposition or generation of a gas, a portion of the heat-sensitive peeling layer disappears or cohesive failure takes place within the heat-sensitive release layer, thus binding force between the light-to-heat conversion layer and the image-forming layer being reduced. Hence, because of this behavior of the heat-sensitive release layer, a portion of the heat-sensitive release layer may adhere to the image-forming layer and may appear on the surface of the finally formed image, thus causing color mixing of the image. Therefore, it is desirable that the heat-sensitive release layer is almost non-colored, i.e., that the heat-sensitive release layer exhibits a high permeability for visible light to prevent the appearance of color mixing on the image to be formed even when such image transfer as described above of the heat-sensitive release layer takes place. Specifically, the light absorption coefficient of the heat-sensitive release layer is preferably 50% or less, more preferably 10% or less.

Additionally, instead of the heat-sensitive release layer being provided separately, the light-to-heat conversion layer can be used as the heat-sensitive release layer by adding the aforementioned heat-sensitive material to the light-to-heat conversion layer-forming coating solution, thus making the light-to-heat conversion layer to serve as both the light-to-heat conversion layer and the heat-sensitive layer.

It is preferred to adjust the static friction coefficient of the outermost layer of the thermal transfer sheet on the image-forming layer-coated side to be 0.35 or less, preferably 0.20 or less. By adjusting the static friction coefficient to be 0.35 or less, roll stain of the thermal transfer sheet upon conveyance can be prevented, and there can be obtained an image with a high image quality. The static friction coefficient is measured according to the method described in Japanese Patent Application No. 85759/2000, paragraph (0011).

The smoothster value of the surface of the image-forming layer at 23° C. and 55% RH is preferably 0.5 to 50 mmHg (≈0.0665 to 6.65 kPa), and Ra thereof is preferably 0.05 to 0.4 μm. Such surface is preferred in respect of transfer and image quality because it can minimize microscopic air gaps which prevent the image-receiving layer and the image-forming layer from contacting with each other. The Ra value can be measured according to JIS B0601 using a surface roughness meter (Surfcom; made by Tokyo Seiki K.K.). The surface hardness of the image-forming layer is preferably 10 g or more measured by using a sapphire needle. The electrostatic charge potential of the image-forming layer generated by electrostatically charging the thermal transfer sheet according to the test standard of US government 4046 and earthing for one second is preferably 100 to 100 V. The surface resistance of the image-forming layer at 23° C. and 55% RH is preferably $10^9$ Ω or less.

Next, the image-receiving sheet to be used in combination with the thermal transfer sheet is described below.

[Image-Receiving Sheet]

(Stratum Structure)

The image-receiving sheet usually comprises a support having provided thereon one or more image-receiving layers and, if necessary, one or more of a cushion layer, a release layer and an intermediate layer between the support and the image-receiving layer. Also, to provide a backing layer on the opposite side of the support to the side on which the image-receiving layer is provided is preferred in respect of conveyance.

(Support)

As a support, there are illustrated common sheet-like substrate materials such as a plastic sheet, a metal sheet, a glass sheet, a resin-coated paper, paper and various composite materials. Examples of the plastic sheet include a polyethylene terephthalate sheet, a polycarbonate sheet, a polyethylene sheet, a polyvinyl chloride sheet, a polyvinylidene chloride sheet, a polystyrene sheet, a styrene-acrylonitrile sheet and a polyester sheet. Also, examples of the paper include regular printing paper and coated paper.

Presence of fine voids in the support is preferred, because it serves to improve image quality. Such support can be prepared by, for example, forming a single-layer or multi-layer film from a molten mixture obtained by mixing a thermoplastic resin with a filler such as an inorganic pigment or a filler composed of a resin incompatible with the thermoplastic resin, using a melt extruder, followed by stretching uniaxially or biaxially. In this case, the void volume depends upon the kind of resin and filler selected, mixing ratio of the two, stretching conditions, etc.

As the thermoplastic resin, a polyolefin resin such as polypropylene and a polyethylene terephthalate resin are preferred, since they have a good crystallinity and a good stretchability, and permit formation of the void with ease. It is preferred to use the polyolefin resin or the polyethylene terephthalate resin as a major component and a small amount of other thermoplastic resin in combination. The inorganic pigment to be used as a filler has an average particle size of preferably 1 to 20 μm, and there may be used calcium carbonate, clay, diatomaceous earth, titanium oxide, aluminum hydroxide, silica, etc. Also, as the non-compatible resin to be used as a filler, it is preferred to use polyethylene terephthalate as a filler in the case of using polypropylene as the thermoplastic resin. Detailed descriptions on the support having fine voids are given in Japanese Patent Application No. 290570/1999.

Additionally, the content of the filler such as an inorganic pigment in the support is generally about 2 to about 30% by volume.

The thickness of the support of the image-receiving sheet is usually 10 to 400 μm, preferably 25 to 200 μm. Also, the surface of the support may be subjected to a surface treatment such as corona discharge treatment, glow discharge treatment, etc. in order to enhance adhesion to the image-receiving layer (or the cushion layer) or adhesion to the image-forming layer of the thermal transfer sheet.

(Image-Receiving Layer)

The surface of the image-receiving sheet is preferably provided with one or more image-receiving layers on the support in order to transfer and fix the image-forming layer. The image-receiving layer is preferably a layer formed from an organic polymeric binder as the major component. The binder is preferably a thermoplastic resin, and examples thereof include homopolymers and copolymers of acrylic monomers such as acrylic acid, methacrylic acid, acrylates, methacrylates, etc.; cellulose polymers such as methyl cellulose, ethyl cellulose and cellulose acetate; homopolymers and copolymers of vinyl monomers such as polystyrene, polyvinyl pyrrolidone, polyvinyl butyral, polyvinyl alcohol, polyvinyl chloride, etc.; condensation polymers such as polyester and polyamide; and rubber polymers such as butadiene-styrene copolymers. The binder in the image-receiving layer is preferably a polymer having a glass transition temperature (Tg) of 90° C. or less, in order to achieve suitable adhesion to the image-forming layer. For this purpose, a plasticizer can also be added to the image-receiving layer. Further, the binder polymer preferably has a Tg of 30° C. or more, in order to prevent blocking among sheets. As the binder polymer in the image-receiving layer, a polymer identical with or similar to the binder polymer in the image-forming layer is particularly preferred, in view of improvement of the adhesion to the image-forming layer during laser recording and improvement of sensitivity and image strength.

The smoothster value of the surface of the image-receiving layer at 23° C. and 55% RH is preferably 0.5 to 50 mmHg (≈0.0665 to 6.65 kPa), and Ra thereof is preferably 0.05 to 0.4 μm. Such surface is preferred in respect of transfer and image quality because it can minimize microscopic air gaps which prevent the image-receiving layer and the image-forming layer from contacting with each other. The Ra value can be measured according to JIS B0601 using a surface roughness meter (Surfcom; made by Tokyo Seiki K.K.). The electrostatic charge potential of the image-forming layer generated by electrostatically charging the image-receiving sheet according to the test standard of US government 4046 and earthing for one second is preferably 100 to 100 V. The surface resistance of the image-receiving layer at 23° C. and 55% RH is preferably $10^9$ Ω or less. The static friction coefficient of the surface of the image-receiving layer is preferably 0.2 or less. The surface energy of the surface of the image-receiving layer is preferably 23 to 35 $mJ/m^2$.

In the case where an image is once formed on the image-receiving layer and then re-transferred to regular printing paper or the like, at least one of the image-receiving layers is preferably formed from a photosetting material. Examples of compositions of such a photosetting material include combinations of a) photo-polymerizable monomers that are composed of at least one kind of multi-functional vinyl or vinylidene compound capable of forming a photo-polymerized product by addition polymerization, b) an organic polymer, and c) a photo-polymerization initiator, and, as needed, additives such as a thermal polymerization inhibitor. As the multi-functional vinyl monomer, unsaturated esters of polyol, particularly acrylates or methacrylates (e.g., ethylene glycol diacrylate or pentaerythritol tetraacrylate) can be used.

As the organic polymer, the above polymer for forming the image-receiving layer can be mentioned. As the photo-polymerization initiator, usual radical photo-polymerization initiators such as benzophenone, Michler's ketone and the like can be used in a proportion of 0.1 to 20% by weight of the layer.

The thickness of the image-receiving layer is 0.3 to 7 μm, preferably 0.7 to 4 μm. When the thickness is 0.3 μm or more, enough strength can be ensured upon re-transfer to regular printing paper. By adjusting the thickness to be 4 μm or less, glossiness of an image after re-transfer to regular printing paper can be depressed, thus similarity to printed products can be improved.

(Other Layers)

A cushion layer may be provided between the support and the image-receiving layer. When the cushion layer is provided, adhesion between the image-forming layer and the image-receiving layer can be improved upon laser thermal transfer, and quality of the image can be improved. Also, even when a foreign matter is mixed in between the thermal transfer sheet and the image-receiving sheet during recording, gaps between the image-receiving layer and the image-forming layer become small due to deformation of the cushion layer and, as a result, the size of image defects such as missing parts can be reduced. Further, in the case where the image formed by transfer is transferred to separately prepared regular printing paper or the like, the image-receiving surface is deformed, depending upon the unevenness of the paper, and thus transferability of the image-receiving layer can be improved and glossiness of the transferred material can be lowered, thereby improving the similarity to printed products.

The cushion layer is structured so as to be easily deformed by application of stress to the image-receiving layer. To achieve this effect, the cushion layer is preferably made of a material with a low elasticity modulus, a material having rubber elasticity or a thermoplastic resin that is easily softened by heating. The elasticity modulus of the cushion layer is preferably 0.5 MPa to 1.0 GPa, particularly preferably 1 MPa to 0.5 GPa. at room temperature. For a foreign matter such as dust to immerse into the cushion layer, the layer has a penetration of a loaded needle specified by JIS K2530 of preferably 10 or more (25° C., 100 g, 5 seconds). The glass transition temperature of the cushion layer is 80° C. or less, preferably 25° C. or less, and the softening point thereof is preferably 50 to 200° C. A plasticizer can be suitably added to the binder to regulate these physical properties such as Tg.

Specific materials that can be used as the binder in the cushion layer include, in addition to rubbers such as urethane rubber, butadiene rubber, nitrile rubber, acrylic rubber, natural rubber, etc., polyethylne, polypropylene, polyester, a styrene-butadiene copolymer, an ethylene-vinyl acetate copolymer, an ethylene-acryl copolymer, a vinyl chloride-vinyl acetate copolymer, vinylidene chloride resin, plasticizer-containing vinyl chloride resin, polyamide resin, phenol resin and the like.

Additionally, the thickness of the cushion layer varies depending upon the resin used and upon other conditions, but is usually 3 to 100 μm, preferably 10 to 52 μm.

The image-receiving layer and the cushion layer should be adhered to each other until the laser recording stage, but for transfer of the image onto regular printing paper, these layers are preferably provided in a releasable manner. To facilitate release, a release layer of about 0.1 to about 2 μm in thickness is preferably provided between the cushion layer and the image-receiving layer. In case where the thickness of the layer is too large, it becomes difficult for the cushion layer to exhibit its performance. Thus, the thickness must be regulated depending upon the kind of the release layer.

Specific examples of the binder for the release layer include polyolefin, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine-containing resin, styrenes such as polystyrene and acrylonitrile styrene, cross-linked products of these resins, thermosetting resins having a Tg of 65 C or more such as polyamide, polyimide, polyether imide, polysulfone, polyether sulfone and aramide, and cured products of these resins. As a curing agent, general curing agents such as isocyanates and melamines may be used.

In selecting the binder for the release layer in consideration of the above physical properties, polycarbonate, acetal and ethyl cellulose are preferred in the point of storage properties and, further, it is particularly preferred to use the acrylic resin in the image-receiving layer because a good releasing properties are obtained upon re-transfer of an image having been thermally transferred by the laser recording.

Also, it is possible to separately use, as a release layer, a layer undergoing an extreme reduction of adhesion to the imabe-receiving layer upon cooling. Specifically, such layer contains a heat-meltable compound such as a wax or a binder, or a thermoplastic resin as a major component.

As the heat-meltable compound, there are illustrated those which are described in Japanese Patent Laid-Open No. 193886/1988. Microcrystalline wax, paraffin wax and carnauba wax are particularly preferably used. As the thermoplastic resin, ethylenic copolymers such as an ethylene-vinyl acetate-based resin, cellulose-based resin, etc. are preferably used.

To such release layer may be added, as additives, a higher fatty acid, a higher alcohol, a higher fatty acid ester, an amide, a higher amine, etc., as needed.

Another structure of the release layer is such that it undergoes melting or softening upon heating to cause cohesive failure itself, thus showing releasing properties. It is preferred to incorporate a super-cooling material in such release layer.

Examples of the super-cooling material include poly-ε-caprolactone, polyoxyethylene, benzotriazole, tribenzylamine, vaniline, etc.

In a release layer of a further structure is contained a compound capable of reducing adhesion to the image-receiving layer. Examples of such compound include silicone-based resin such as silicone oil; Teflon; fluorine-containing resins such as fluorine-containing acrylic resin; polysiloxane resins; acetal-based resins such as polyvinyl butyral, polyvinyl acetal and polyvinyl formal; solid waxes such as polyethylene wax and amide wax; and surfactants such as fluorine-containing surfactants and phosphate-based surfactants.

As a method for forming the release layer, there may be applied a coating method of dissolving, or dispersing in a latex form, the material in a solvent using a blade coater, a roll coater, a bar coater, a curtain coater or a gravure coater and coating the resultant solution or dispersion, and a laminating method by hot-melt extrusion. The release layer can be formed on the cushion layer by coating. Or, there is a method of forming the release layer by coating the solution or the latex dispersion in a solvent on a tentative base, and laminating the thus formed layer on the cushion layer, followed by delaminating the tentative base.

The image-receiving sheet to be combined with the thermal transfer sheet may have a structure wherein the image-receiving layer also functions as the cushion layer. In this case, the image-receiving sheet may have a structure of support/cushioning image-receiving layer or a structure of support/undercoating layer/cushioning image-receiving layer. In this case, too, it is preferred to provide the cushioning image-receiving layer in a releasable manner so as to enable to re-transfer to regular printing paper. In this case, the image re-transferred to regular printing paper becomes an image excellent in glossiness.

Additionally, the thickness of the cushioning image-receiving layer is 5 to 100 μm, preferably 10 to 40 μm.

A backing layer provided in the image-receiving sheet on the opposite side of the support to the side on which the image-receiving layer is provided serves to improve conveying performance, thus being preferred. Addition of a surfactant, an antistatic agent formed by tin oxide fine particles, or a matting agent formed by silicon oxide or PMMA particles is preferred in the point of improving conveying performance within the recording apparatus.

The additives can be added not only to the backing layer but also to the image-receiving layer and other layers, if necessary. Kinds of the additives are not generally described depending upon the end-use but, with the matting agent, particles of 0.5 to 10 μm in average particle size can be added to the layer in a content of about 0.5 to about 80%. The antistatic agent can be appropriately selected and used from various surfactants and electricaly conductive agents such that the surface resistance of the backing layer is preferably $10^{12}$ Ω or less, more preferably $10^{9}$ Ω or less under the conditions of 23° C. and 50% RH.

As the binder to be used in the backing layer, there may be used general-purpose polymers such as gelatin, polyvinyl alcohol, methyl cellulose, nitrocellulose, acetyl cellulose, aromatic polyamide resin, silicone resin, epoxy resin, alkyd resin, phenol resin, melamine resin, fluorine-containing resin, polyimide resin, urethane resin, acrylic resin, urethane-modified silicone resin, polyethylene resin, polypropylene resin, polyester resin, Teflon resin, polyvinyl butyral resin, vinyl chloride-based resin, polyvinyl acetate, polycarbonate, organo-boron compound, aromatic esters, fluorinated polyurethane, polyether sulfone, etc.

It is effective for preventing removal of the matting agent or improving flaw resistance of the backing layer to use a cross-linkable water-soluble binder as the binder for the backing layer and cross-linking it. Also, it is greatly effective for preventing blocking during storage.

As this cross-linking means, one of, or a combination of, heat, actinic rays and pressure may be employed with no limitation depending upon the properties of the cross-linking agent to be used. In some cases, any adhesive layer may be provided on the opposite side of the support to the side on which the backing layer is provided, for the purpose of imparting adhesion properties to the support.

As the matting agent to be preferably added to the backing layer, organic or inorganic fine particles may be used. Examples of the organic matting agent include fine particles of radical polymerization type polymers such as polymethyl methacrylate (PMMA), polystyrene, polyethylene, polypropylene and the like, and fine polymers of condensation type polymers such as polyester, polycarbonate and the like.

The backing layer is preferably provided in an amount of about 0.5 to about 5 $g/m^2$. In case when the amount is less than 0.5 $g/m^2$, there results unstable coating properties, and the problem of removal of the matting agent is liable to arise. Also, in case when coated in an amount much larger than 5 $g/m^2$, particle size of a preferred matting agent becomes so large that embossing of the image-receiving layer surface by the backing layer takes place during storage, which is liable to cause missing or unevenness of a recorded image particularly with thermal transfer of transferring a thin image-forming layer.

The matting agent preferably has a number average particle size greater than the thickness of the binder alone of the backing layer by 2.5 to 20 μm. Among the matting agents, those which contain particles of 8 μm or more in size in a content of 5 $mg/m^2$ or more, preferably 6 to 600 $mg/m^2$, are necessary. Such matting agents serve to prevent foreign matter troubles. Also, use of a matting agent having such a narrow particle size distribution that a σ/rn value (=coefficient of variation) obtained by dividing the standard deviation of the particle size distribution by the number average particle size becomes 0.3 or less serves to remove defects to be otherwise generated due to particles having an abnormally large particle size and to provide desired performance even when added in a smaller amount. This coefficient of variation is more preferably 0.15 or less.

To the backing layer is preferably added an antistatic agent for the purpose of preventing adhesion of a foreign matter due to frictional charging with conveying rolls. As the antistatic agent, there may be widely used cationic surfactants, anionic surfactants, nonionic surfactants, high molecular antistatic agents, electroconductive fine particles as well as those compounds described in "11290 No Kagaku Shohin" published by Kagaku Kogyo Nippo Sha, pp.875 to 876.

As the antistatic agent to be used in the backing layer, carbon black, a metal oxide such as zinc oxide, titanium oxide or tin oxide, and conductive fine particles such as an organic semiconductor are preferably used among the above-described materials. Particularly, use of conductive fine particles is preferred because the antistatic agent is not released from the backing layer, and a stable antistatic effect is obtained regardless of environment.

Also, various active agents, silicone oil, and a parting agent such as a fluorine-containing resin may be added to the backing layer for the purpose of imparting coating properties or parting properties.

The backing layer is particularly preferred when the softening points of the cushion layer and the image-receiving layer measured according to TMA (Thermomechanical Analysis) are 70° C. or less.

The TMA softening point is determined by raising the temperature of a sample to be measured at a constant rate while applying a constant load, and observing the phase of the sample. In the invention, a temperature at which phase of the sample start to change is determined to be the TMA softening point. Measurement of the softening point by TMA can be conducted using an apparatus such as Thermoflex made by Rigaku Denki Sha.

The thermal transfer sheet and the image-receiving sheet can be used as a laminate wherein the image-forming layer of the thermal transfer sheet is superimposed on the image-receiving layer of the image-receiving sheet, for forming an image.

The laminate consisting of the thermal transfer sheet and the image-receiving sheet can be formed by various methods. For example, the laminate can be easily obtained by super imposing the image-forming layer of the thermal transfer sheet on the image-receiving layer of the image-receiving sheet, and passing the resulting laminate between pressing and heating rollers. A heating temperature in this case is preferably 160° C. or less, more preferably 130° C. or less.

As another method of obtaining the laminate, a vacuum adhesion method can also be preferably used. The vacuum adhesion method is a method in which the image-receiving sheet is first wound on a drum having vacuum-drawing suction holes and then the thermal transfer sheet slightly larger than the image-receiving sheet is vacuum-bonded to the image-receiving sheet under uniform extrusion of air by squeeze rollers. As another method, there is also a method in which the image-receiving sheet is stretched and mechanically stuck to a metal drum, and then the thermal transfer sheet is mechanically stretched and stuck to the image-receiving sheet in the same manner. Among these methods, the vacuum adhesion method is particularly preferable in view of rapid and easy uniform lamination without requiring regulation of the temperature of heat rollers or the like.

DESCRIPTION OF THE REFERENCE NUMERALS AND SIGNS

Figure 1:
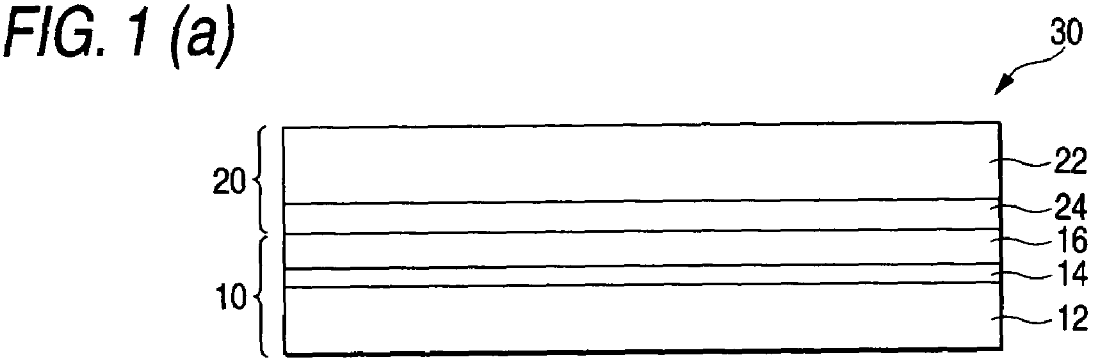
FIG. 1 is a drawing showing the outline of the mechanism of forming a multi-color image by thin-film thermal transfer using a laser light.
Figure 1:
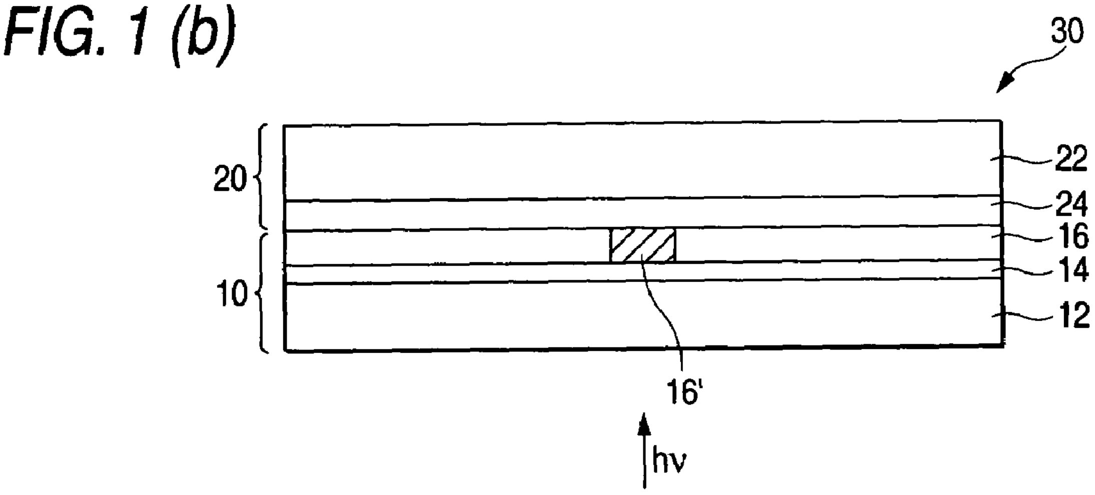
Figure 1:
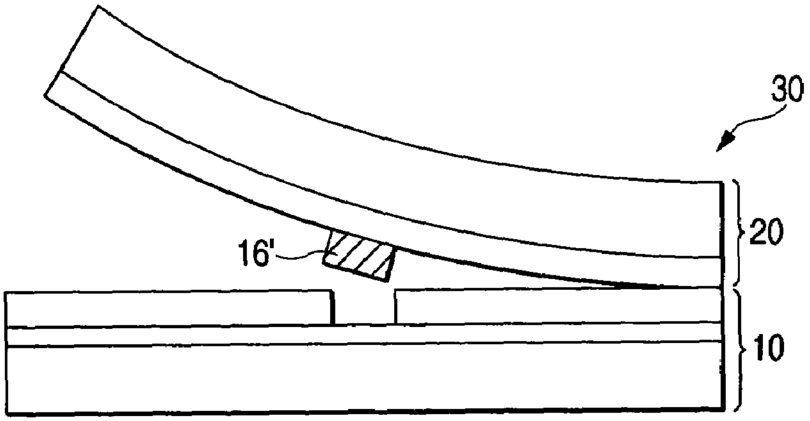
Figure 2:
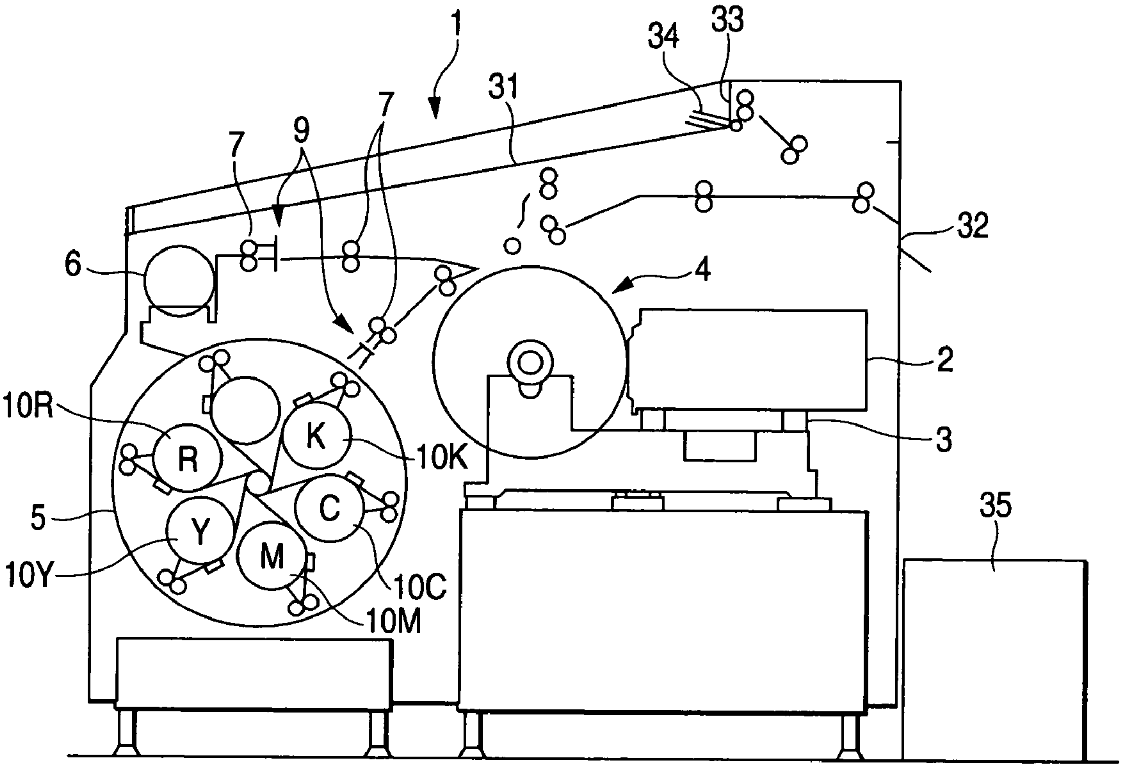
FIG. 2 is a drawing showing an example of a constitution of a recording apparatus for laser thermal transfer.
Figure 3:
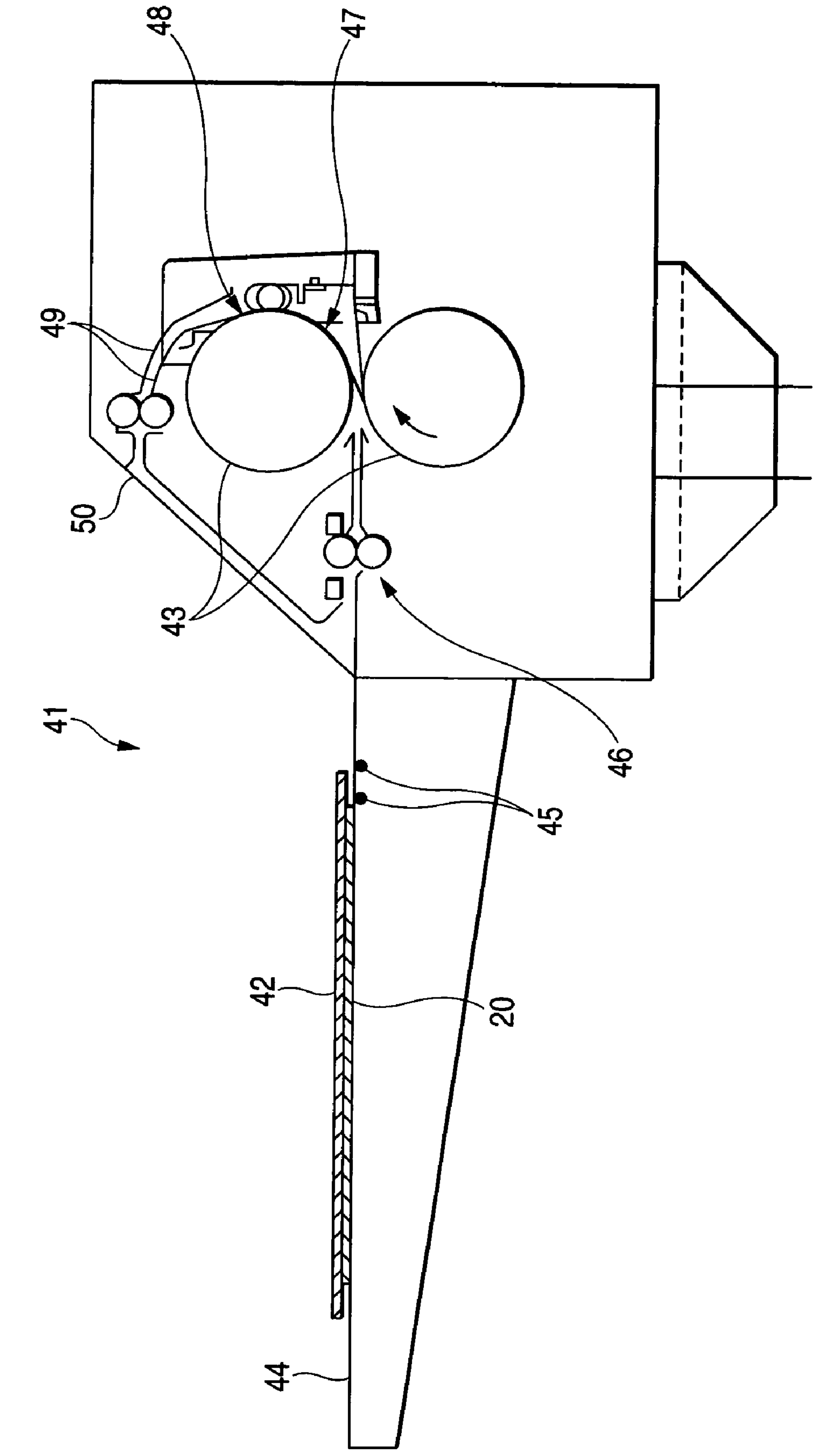
FIG. 3 is a drawing showing an example of a constitution of a thermal transfer apparatus.

1 recording apparatus; 2 recording head; 3 sub-scanning rail; 4 recording drum; 5 thermal transfer sheet-loading unit; 6 imag-receiving sheet roll; 7 conveying rollers; 8 squeeze rollers; 9 cutter; 10 thermal transfer sheet; 10K, 10C, 10M, 10Y, 10R thermal transfer sheet rolls; 12 support; 13 light-to-heat conversion layer; 16 image-forming layer; 20 image-receiving sheet; 22 support for the image-receiving sheet; 24 image-receiving layer; 30 laminate; 31 discharge support; 32 waste outlet; 33 discharge outlet; 34 air; 35 waste box; 42 regular paper; 43 heat roller; 44 inserting support; 45 mark showing the placing position; 46 inserting rollers; 47 guide made of a heat-resistant sheet; 48 peeling claw; 49 guide plate; 50 discharge outlet

BEST MODE FOR CARRYING OUT THE INVENTION

Hereinafter, Examples of the invention are described, which however do not limit the invention. Additionally, unless otherwise specified, “parts” means “parts by weight”.

EXAMPLE 1

Preparation of Thermal Transfer Sheet R (Red)

[Formation of a Backing Layer]

[Preparation of a Coating Solution for a First Backing Layer]

| | |
|---|---|
| Aqueous dispersion of acrylic resin (Julimer ET410; solid content: 20% by weight; made by Nippon Junyaku K.K.) | 2 parts |
| Antistatic agent (aqueous dispersion of tin oxide-antimony oxide) (average particle size: 0.1 μm; 17% by weight) | 7.0 parts |
| Polyoxyethylene phenyl ether | 0.1 part |
| Melamine compound (Sumitics Resin M-3; made by Sumitomo Chemical Industries Co., Ltd.) | 0.3 part |
| Distilled water | to make 100 parts |

[Formation of the First Backing Layer]

One side (back side) of a 75-μm thick biaxially stretched polyethylene terephthalate support (Ra of both sides: 0.01 μm) was subjected to corona discharge treatment, and the coating solution for the first backing layer was coated thereon in a dry thickness of 0.03 μm, followed by drying at 180° C. for 30 seconds to form the first backing layer. The Young’s modulus of the support in the longitudinal direction was 450 Kg/mm2 (≈4.4 GPa), and the Young’s modulus in the transverse direction was 500 Kg/mm$^2$ (≈4.9 GPa). The F-5 value of the support in the longitudinal direction was 10 Kg/mm$^2$ (≈9.8 MPa), and the F-5 value in the transverse direction was 13 Kg/mm$^2$ (≈127.4 MPa). The heat-shrinking ratio of the support at 100° C. for 30 minutes in the longitudinal direction was 0.3%, and that in the transverse direction was 0.1%. The breaking strength in the longitudinal direction was 20 Kg/mm$^2$ (≈0.196 MPa), and that in the transverse direction was 25 Kg/mm$^2$ (≈245 MPa). The elasticity modulus was 400 Kg/mm$^2$ (≈3.9 GPa).

[Preparation of a Coating Solution for a Second Backing Layer]

| | |
|---|---|
| Polyolefin (chemipearl S-120; 27% by weight; made by Mitsui Sekiyu Kagaku K.K.) | 3.0 parts |
| Antistatic agent (aqueous dispersion of tin oxide-antimony oxide) (average particle size: 0.1 μm; 17% by weight) | 2.0 parts |
| Colloidal silica (Snowtex C; 20% by weight; made by Nissan Kagaku K.K.) | 2.0 parts |
| Epoxy compound (Dinacol EX-614B; made by Nagase Kasei K.K.) | 0.3 part |
| Distilled water | to make 100 parts |

[Formation of the Second Backing Layer]

On the first backing layer was coated the coating solution for the second backing layer in a dry thickness of 0.03 μm, followed by drying at 170° C. for 30 seconds to form the second backing layer.

[Formation of a Light-to-Heat Conversion Layer]

[Preparation of a Coating Solution for the Light-to-Heat Conversion Layer]

The following ingredients were mixed under stirring with a stirrer to prepare a coating solution for the light-to-heat conversion layer.

[Composition of the Coating Solution for the Light-to-Heat Conversion Layer]

Infrared absorbing colorant (NK-2014; 7.6 parts made by Nihon Kanko Shikiso Co., Ltd.;

cyanine colorant of the following structure:

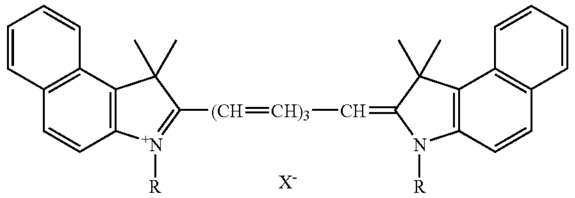

wherein R represents $CH_3$, and $X^-$ represents $ClO_4^-$. Polyimide resin of the following structure: 29.3 parts (“Rikacoat SN-20F; made by New Japan Chemical Co., Ltd.; thermal decomposition temperature: 510° C.)

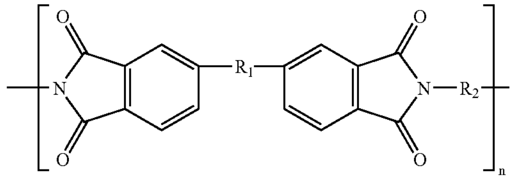

wherein $R_1$ represents $SO_2$, and $R_2$ represents

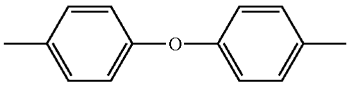

or

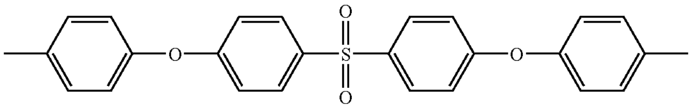

| | |
|---|---|
| Exon naphtha | 5.8 parts |
| N-methylpyrrolidone (NMP) | 1500 parts |
| Methyl ethyl ketone | 360 parts |
| Surfactant (Megafac F-176PF; made by Dai-nippon Ink & Chemicals, Inc.; F-series surfactant) | 0.5 part |
| Dispersion of a matting agent of the following composition: | 14.1 parts |

Preparation of the Dispersion of the Matting Agent:

10 parts of truly spherical silica fine particles of 1.5 μm in average particle size (Seahoster KEP 150 made by Nihon Shokubai K.K.), 2 parts of a dispersant polymer (acrylate-styrene copolymer; made by Johnson Polymer K.K.; Juncryl 611), 16 parts of methyl ethyl ketone and 64 parts of N-methylpyrrolidone were mixed, and the resulting mixture and 30 parts of glass beads of 2 mm in diameter were placed in a 200-ml polyethylene vessel, followed by dispersing in a paint shaker (made by Toyo Seiki) for 2 hours to obtain a dispersion of silica fine particles.

[Formation of a Light-to-Heat Conversion Layer on the Surface of the Support]

On the one surface of the 75-μm thick polyethylene terephthalate film (support) was coated the above-described coating solution for the light-to-heat conversion layer using a wire bar, followed by drying the coated product in a 120° C. oven for 2 minutes to form the light-to-heat conversion layer on the support. The optical density of the thus obtained light-to-heat conversion layer at a wavelength of 808 nm was measured to be OD=0.93 using a UV-spectrophotometer, UV-240, made by Shimazu Seisakusho. The thickness was measured to be 0.3 μm on the average by observing cross section of the light-to-heat conversion layer using a scanning type electron microscope.

[Formation of an Image-Forming Layer]

[Preparation of a Coating Solution for a Red Image-Forming Layer]

The following ingredients were placed in a mill of a kneader, and a shearing force was applied thereto while adding thereto a solvent by portions to conduct treatment before dispersing. To the resulting dispersion was further added a solvent to adjust so as to finally obtain the following formulation, followed by conducting sand mill dispersion for 2 hours to obtain a pigment dispersion mother liquor.

[Formulation of the Red Pigment Dispersion Mother Liquor]

| | |
|---|---|
| Pigment dispersion 1 | |
| Pigment Red 48:1 (C.I. No. 15865:1) (Lionol Red 2B-FG3300; made by Toyo Ink Mfg. Co., Ltd.) | 8.93 parts |
| Polyvinyl butyral (Esreck B BL-SH; made by Sekisui Chemical Co., Ltd.) | 7.50 parts |

-continued

| | |
|---|---|
| Dispersing aid (Solsperse S-20000; made by ICI) | 0.47 part |
| n-propyl alcohol | 83.10 parts |
| Pigment dispersion 2 | |
| Pigment Red 48:3 (C.I. No. 15865:3) (Symuler Red 3108; made by Dai-nippon Ink & Chemicals, Inc.) | 8.93 parts |
| Polyvinyl butyral (Esreck B BL-SH; made by Sekisui Chemical Co., Ltd.) | 7.50 parts |
| Dispersing aid (Solsperse S-20000; made by ICI) | 0.47 part |
| n-propyl alcohol | 83.10 parts |

Particles of the thus obtained pigment dispersions 1 and 2 were measured using a laser-scattering type particle size distribution-measuring meter, and it was found that the average particle sizes thereof were 192 nm and 193 nm, respectively.

Next, the following ingredients were mixed under stirring with a stirrer to prepare a coating solution for a red image-forming layer.

[Formulation of a Coating Solution for the Red Image-Forming Layer]

| | |
|---|---|
| n-propyl alcohol | 321.5 parts |
| Methyl ethyl ketone | 89.3 parts |
| Wax compounds | |
| (Stearic amide "Newtron 2"; made by Nippon Fine Chemical Co., Ltd.) | 0.824 part |
| (Behenic amide "Diamid BM"; made by Nippon Kasei Chemical Co., Ltd.) | 0.824 part |
| (Lauric amide "Diamid Y"; made by Nippon Kasei Chemical Co., Ltd.) | 0.824 part |
| (Palmitic amide "Diamid KP"; made by Nippon Kasei Chemical Co., Ltd.) | 0.824 part |
| (Oleic amide "Diamid O-200"; made by Nippon Kasei Chemical Co., Ltd.) | 0.824 part |
| (Erucic amide "Diamid L-200"; made by Nippon Kasei Chemical Co., Ltd.) | 0.824 part |
| Rosin (KE-311; made by Arakawa Kagaku Co., Ltd.; resin ingredients: abietic acid 30 to 40%; neoabietic acid 10 to 20%; dihydroabietic acid 14%; tetrahydroabietic acid 14%) | 2.360 parts |

-continued

| | |
|---|---|
| Polyvinyl butyral (Esreck B BL-SH; made by Sekisui Chemical Co., Ltd.) | 1.455 parts |
| Pigment dispersion 1 | 77.40 parts |
| Pigment dispersion 2 | 24.40 parts |
| Surfactant (Megafac F-176PF; solid content: 20%; made by Dai-nippon Ink & Chemicals, Inc.) | 1.216 parts |

[Formation of the Red Image-Forming Layer on the Surface of the Light-to-Heat Conversion Layer]

On the surface of the light-to-heat conversion layer was coated the above-mentioned coating solution for the red image-forming layer using a wire bar for one minute, followed by drying the coated product in a 100° C. oven for 2 minutes to form the red image-forming layer on the light-to-heat conversion layer. Thus, the thermal transfer sheet R was prepared by these steps, wherein the light-to-heat conversion layer and the red image-forming layer were provided in this order on the support.

The thickness of the red image-forming layer of the thermal transfer sheet R was measured to be 0.71 μm on the average.

Physical properties of the thus obtained image-forming layer were as follows.

The surface hardness of the image-forming layer is preferably 10 g or more when measured using a sapphire needle, and was specifically 200 g or more.

The smoothster value of the surface is preferably 0.5 to 50 mmHg (≈0.0665 to 6.65 kPa) at 23° C. and 55% RH, and was specifically 27 mmHg (≈3.60 kPa).

The static friction coefficient of the surface is preferably 0.2 or less, and was specifically 0.08.

The contact angle with water was 46.8 degrees.

Preparation of Thermal Transfer Sheet Y

A thermal transfer sheet Y was prepared in the same manner as with the preparation of the thermal transfer sheet R except for using a coating solution for a yellow image-forming layer of the following formulation in place of the coating solution for the red image-forming layer. The thickness of the image-forming layer of the resulting thermal transfer sheet Y was 0.42 μm.

[Formulation of the Yellow Pigment Dispersion Mother Liquor]

| Formulation 1 of yellow pigment dispersion mother liquor | |
|---|---|
| Polyvinyl butyral (Esreck B BL-SH; made by Sekisui Chemical Co., Ltd.) | 7.1 parts |
| Pigment Yellow 180 (C.I. No. 21290) (Novoperm Yellow P-HG; made by Clariant Japan K.K.) | 12.9 parts |
| Dispersing aid (Solsperse S-20000; made by ICI) | 0.6 part |
| n-Propyl alcohol | 79.4 parts |

[Formulation of the Yellow Pigment Dispersion Mother Liquor]

| Formulation 2 of yellow pigment dispersion mother liquor | |
|---|---|
| Polyvinyl butyral (Esreck B BL-SH; made by Sekisui Chemical Co., Ltd.) | 7.1 parts |

-continued

| Formulation 2 of yellow pigment dispersion mother liquor | |
|---|---|
| Pigment Yellow 139 (C.I. No. 56298) (Novoperm Yellow M2R 70; made by Clariant Japan K. K.) | 12.9 parts |
| Dispersing aid (Solsperse S-20000; made by ICI) | 0.6 part |
| n-Propyl alcohol | 79.4 parts |

[Formulation of a Coating Solution for the Red Image-Forming Layer]

| | |
|---|---|
| The above-mentioned yellow pigment dispersion mother liquors (Formulation 1 of the yellow pigment:Formulation 2 of the yellowigment 2 = 95:5) | 126 parts |
| Polyvinyl butyral (Esreck B bBL-SH; made by Sekisui Chemical Co., Ltd.) | 4.6 parts |
| Wax compounds | |
| (Stearic amide "Newtron 2"; made by Nippon Fine Chemical Co., Ltd.) | 0.7 part |
| (Behenic amide "Diamid BM"; made by Nippon Kasei Chemical Co., Ltd.) | 0.7 part |
| (Lauric amide "Diamid Y"; made by Nippon Kasei Chemical Co., Ltd.) | 0.7 part |
| (Palmitic amide "Diamid KP"; made by Nippon Kasei Chemical Co., Ltd.) | 0.7 part |
| (Erucic amide "Diamid L-200"; made by Nippon Kasei Chemical Co., Ltd.) | 0.7 part |
| (Oleic amide "Diamid O-200"; made by Nippon Kasei Chemical Co., Ltd.) | 0.7 part |
| Nonionic surfactant (Chemistat 1100; made by Sanyo Chemical Industries, Ltd.) | 0.4 part |
| Rosin (KE-311; made by Arakawa Kagaku Co., Ltd.) | 2.4 parts |
| Surfactant (Megafac F-176PF; solid content: 20%; made by Dai-nippon Ink & Chemicals, Inc.) | 0.8 part |
| n-Propyl alcohol | 793 parts |
| Methyl ethyl ketone | 198 parts |

Physical properties of the thus obtained image-forming layer were as follows.

The surface hardness of the image-forming layer is preferably 10 g or more when measured using a sapphire needle, and was specifically 200 g or more.

The smoothster value of the surface is preferably 0.5 to 50 mmHg (≈0.0665 to 6.65 kPa) at 23° C. and 55% RH, and was specifically 2.3 mmHg (≈0.31 kPa).

The static friction coefficient of the surface is preferably 0.2 or less, and was specifically 0.1.

The surface energy was 24 mJ/m$^2$. The contact angle with water was 108.1 degrees. The deformation ratio of the light-to-heat conversion layer upon recording with a laser light of 100 W/mm$^2$ or more in light intensity on their radiated surface at a line speed of 1 m/sec or more was 150%.

Preparation of Thermal Transfer Sheet M

A thermal transfer sheet M was prepared in the same manner as with the preparation of the thermal transfer sheet R except for using a coating solution for a magenta image-forming layer of the following formulation in place of the coating solution for the red image-forming layer. The thickness of the image-forming layer of the resulting thermal transfer sheet M was 0.38 μm.

[Formulation of the Magenta Pigment Dispersion Mother Liquor]

| Formulation 1 of magenta pigment dispersion mother liquor | |
|---|---|
| Polyvinyl butyral (Denka Butyral #2000-L; made by Denki Kagaku Koogyo K.K.; Vicat softening point: 57 ° C.) | 12.6 parts |
| Pigment Red 57:1 (C.I. No. 15850) (Symuler Brilliant Carmine 6B-229; made by Dai-nippon Ink & Chemicals, Inc.) | 15.0 parts |
| Dispersing aid (Solsperse S-20000; made by ICI) | 0.6 part |
| n-Propyl alcohol | 80.4 parts |

[Formulation of the Magenta Pigment Dispersion Mother Liquor]

| Formulation 2 of magenta pigment dispersion mother liquor | |
|---|---|
| Polyvinyl butyral (Denka Butyral #2000-L; made by Denki Kagaku Kogyo K.K.; Vicat softening point: 57° C.) | 12.6 parts |
| Pigment Red 57:1 (C.I. No. 15850:1) (Lionol Red 6B-4290G; made by Toyo Ink Mfg. Co., Ltd.) | 15.0 parts |
| Dispersing aid (Solsperse S-20000; made by ICI) | 0.6 part |
| n-Propyl alcohol | 79.4 parts |

[Formulation of a Coating Solution for the Magenta Image-Forming Layer]

| | |
|---|---|
| The above-mentioned magenta pigment dispersion mother liquors (Formulation 1 of the yellow pigment: Formulation 2 of the yellow pigment 2 = 95:5(parts)) | 163 parts |
| Polyvinyl butyral (Denka Butyral #2000-L; made by Denki Kagaku Kogyo K.K.; Vicat softening point: 57° C.) | 4.0 parts |
| Wax compounds | |
| (Stearic amide "Newtron 2"; made by Nippon Fine Chemical Co., Ltd.) | 1.0 part |
| (Behenic amide "Diamid BM"; made by Nippon Kasei Chemical Co., Ltd.) | 2.0 part |
| (Palmitic amide "Diamid KP"; made by Nippon Kasei Chemical Co., Ltd.) | 1.0 part |
| (Erucic amide "Diamid L-200"; made by Nippon Kasei Chemical Co., Ltd.) | 1.0 part |
| (Oleic amide "Diamid O-200"; made by Nippon Kasei Chemical Co., Ltd.) | 1.0 part |
| Nonionic surfactant (Chemistat 1100; made by Sanyo Chemical Industries, Ltd.) | 0.7 part |
| Rosin (KE-311; made by Arakawa Kagaku Co., Ltd.) | 4.6 parts |
| Pentaerythritol tetraacrylate (NK ester A-TMMT; made by Shin-Nakamura Kagaku K.K.) | 2.5 parts |
| Surfactant (Megafac F-176PF; solid content: 20%; made by Dai-nippon Ink & Chemicals, Inc.) | 1.3 part |
| n-Propyl alcohol | 848 parts |
| Methyl ethyl ketone | 246 parts |

Physical properties of the thus obtained image-forming layer were as follows.

The surface hardness of the image-forming layer is preferably 10 g or more when measured using a sapphire needle, and was specifically 200 g or more.

The smoothster value of the surface is preferably 0.5 to 50 mmHg (≈0.0665 to 6.65 kPa) at 23° C. and 55% RH, and was specifically 3.5 mmHg (≈0.47 kPa).

The static friction coefficient of the surface is preferably 0.2 or less, and was specifically 0.08.

The surface energy was 25 mJ/m$^2$. The contact angle with water was 98.8 degrees. The deformation ratio of the light-to-heat conversion layer upon recording with a laser light of 1000 W/mm$^2$ or more in light intensity on the irradiated surface at a line speed of 1 m/sec or more was 160%.

Preparation of Thermal Transfer Sheet C

A thermal transfer sheet C was prepared in the same manner as with the preparation of the thermal transfer sheet R except for using a coating solution for a cyan image-forming layer of the following formulation in place of the coating solution for the red image-forming layer. The thickness of the image-forming layer of the resulting thermal transfer sheet C was 0.45 μm.

[Formulation of the Magenta Pigment Dispersion Mother Liquor]

| Formulation 1 of magenta pigment dispersion mother liquor: | |
|---|---|
| Polyvinyl butyral (Esreck B BL-SH; made by Sekisui Chemical Co., Ltd.) | 12.6 parts |
| Pigment Blue 15:4 (C.I. No. 74160) (Cyanine Blue 700-10FG; made by Toyo Ink Mfg. Co., Ltd.) | 15.0 parts |
| Dispersing aid (PW-36; made by Kusumoto Kasei K.K.) | 0.6 part |
| n-Propyl alcohol | 110 parts |

[Formulation of the Cyan Pigment Dispersion Mother Liquor]

| Formulation 2 of cyan pigment dispersion mother liquor: | |
|---|---|
| Polyvinyl butyral (Esreck B BL-SH; made by Sekisui Chemical Co., Ltd.) | 12.6 parts |
| Pigment Blue 15 (C.I. No. 74160) (Lionol Blue 7027; made by Toyo Ink Mfg. Co., Ltd.) | 15.0 parts |
| Dispersing aid (PW-36; made by Kusumoto Kasei K.K.) | 0.6 part |
| n-Propyl alcohol | 110 parts |

[Formulation of a Coating Solution for the Cyan Image-Forming Layer]

| | |
|---|---|
| The above-mentioned cyan pigment dispersion mother liquors (Formulation 1 of the cyan pigment: Formulation 2 of the cyan pigment 2 = 90:10 (parts)) | 118 parts |
| Polyvinyl butyral (Esreck B BL-SH; made by Sekisui Chemical Co., Ltd.) | 4.0 parts |
| Inorganic pigment "MEK-ST" | 1.3 parts |

-continued

| | |
|---|---|
| Wax compounds | |
| (Stearic amide "Newtron 2"; made by Nippon Fine Chemical Co., Ltd.) | 1.0 part |
| (Behenic amide "Diamid BM"; made by Nippon Kasei Chemical Co., Ltd.) | 1.0 part |
| (Lauric amide "Diamid Y"; made by Nippon Kasei Chemical Co., Ltd.) | 1.0 part |
| (Palmitic amide "Diamid KP"; made by Nippon Kasei Chemical Co., Ltd.) | 1.0 part |
| (Erucic amide "Diamid L-200"; made by Nippon Kasei Chemical Co., Ltd.) | 1.0 part |
| (Oleic amide "Diamid O-200"; made by Nippon Kasei Chemical Co., Ltd.) | 1.0 part |
| Rosin (KE-311; made by Arakawa Kagaku Co., Ltd.) | 2.8 parts |
| Pentaerythritol tetraacrylate (NK ester A-TMMT; made by Shin-Nakamura Kagaku K.K.) | 1.7 parts |
| Surfactant (Megafac F-176PF; solid content: 20%; made by Dai-nippon Ink & Chemicals, Inc.) | 1.7 part |
| n-Propyl alcohol | 890 parts |
| Methyl ethyl ketone | 247 parts |

Physical properties of the thus obtained image-forming layer were as follows.

The surface hardness of the image-forming layer is preferably 10 g or more when measured using a sapphire needle, and was specifically 200 g or more.

The smoothster value of the surface is preferably 0.5 to 50 mmHg (≈0.0665 to 6.65 kPa) at 23° C. and 55% RH, and was specifically 7.0 mmHg (≈0.93 kPa).

The static friction coefficient of the surface is preferably 0.2 or less, and was specifically 0.08.

The surface energy was 25 mJ/m2. The contact angle with water was 98.8 degrees. The deformation ratio of the light-to-heat conversion layer upon recording with a laser light of 1000 W/$mm^2$ or more in light intensity on the irradiated surface at a line speed of 1 m/sec or more was 165%.

Preparation of an Image-Receiving Sheet

A coating solution of the following formulation for a cushion layer and a coating solution of the following formulation for an image-receiving layer were prepared.

| | |
|---|---|
| 1) Coating solution for a cushion layer | |
| Vinyl chloride-vinyl acetate copolymer (main binder; MPR-TSL; made by Nisshin Chemical Industry Co., Ltd.) | 20 parts |
| Plasticizer (Paraplex G-40; made by CP. HALL. COMPANY) | 10 parts |
| Surfactant (fluorine-containing type; coating aid; Megafac F-177; made by Dai-nippon Ink & Chemicvals, Inc.) | 0.5 part |
| Antistatic agent (quaternary ammonium salt; SAT-5 Supper (IC); made by Nippon Junyaku Co., Ltd.) | 0.3 part |
| Methyl ethyl ketone | 60 parts |
| Toluene | 10 parts |
| N,N-Dimethylformamide | 3 parts |
| 2) Coating solution for an image-receiving layer | |
| Polyvinyl butyral (Esreck B BL-SH; made by Sekisui Chemical Co., Ltd.) | 8.0 parts |
| Antistatic agent (Sunstat 2012A; made by Sanyo Chemical Industries, Ltd.) | 0.7 part |
| Surfactant (Megafac F-176PF; solid content: 20%; made by Dai-nippon Ink & Chemicals, Inc.) | 0.1 part |

-continued

| | |
|---|---|
| n-Propyl alcohol | 20 parts |
| Methanol | 20 parts |
| 1-Methoxy-2-propanol | 50 parts |

Using a small-width coating machine, the above coating solution for the cushion layer was coated onto a white PET support (Lumilar #130E58; made by Toray Co., Ltd.; thickness: 130 μm), followed by drying the coated layer. Then, the coating solution for the image-receiving layer was coated thereon and dried. The amounts of the coating solutions were regulated such that the thickness of the cushion layer after drying was about 20 μm, and the thickness of the image-receiving layer was about 2 μm. The white PET support is a void-containing plastic support composed of a laminate (total thickness: 130 μm; specific gravity: 0.8) of a void-containing polyethylene terephthalate layer (thickness: 116 μm; void volume: 20%) and a titanium oxide-containing polyethylene terephthalate layer (thickness: 7 μm; content of titanium oxide: 2%) provided on both sides thereof. The prepared material was wound into a roll, stored at room temperature for one week and used for image recording with a laser light as described below.

Physical properties of the thus obtained image-receiving layer were as follows.

The surface roughness Ra is preferably 0.4 to 0.01 μm, and was specifically 0.02 μm.

The surface waviness of the image-receiving layer is preferably 2 μm or less, and was specifically 1.2 μm.

The smoothster value of the surface of the image-receiving layer is preferably 0.5 to 50 mmHg (≈0.0665 to 6.65 kPa) at 23° C. and 55% RH, and was specifically 0.8 mmHg (=. 0.11 kPa).

The static friction coefficient of the surface of the image-receiving layer is preferably 0.8 or less, and was specifically 0.37.

The surface energy of the surface of the image-receiving layer was 29 mJ/$m^2$. The contact angle with water was 85 degrees.

Thus, there was obtained a multi-color image-forming material composed of the thermal transfer sheets R, Y, M and C, and the image-receiving sheet.

EXAMPLE 2

Preparation of Thermal Transfer Sheet B (Blue)

A thermal transfer sheet B was prepared in the same manner as with the preparation of the thermal transfer sheet R except for using a coating solution for a blue image-forming layer of the following formulation in place of the coating solution for the red image-forming layer. The thickness of the image-forming layer of the resulting thermal transfer sheet B was 0.95 μm.

[Formulation of the Blue Pigment Dispersion Mother Liquor]

Pigment Dispersion 3

| | |
|---|---|
| Pigment Blue 60 (C.I. No. 69800) (Fastogen Super Blue 6070S; made by Dai-nippon Ink & Chemicals, Inc.) | 4.02 parts |
| Pigment Blue 15:6 (C.I. No. 74160) (Lionol Blue 7600; made by Toyo Ink Mfg. Co., Ltd.) | 4.02 parts |

-continued

| | |
|---|---|
| Pigment Violet 23 (C.I. No. 51319) (Hosterperm Violet RL-NF; made by Clariant Japan K.K.) | 0.89 part |
| Polyvinyl butyral (Esreck B BL-SH; made by Sekisui Chemical Co., Ltd.) | 7.50 parts |
| Dispersing aid (Solsperse S-20000; made by ICI) | 0.47 part |
| n-Propyl alcohol | 83.10 parts |

Particle size of the thus obtained pigment dispersion was measured using a laser-scattering type particle size distribution-measuring meter, which indicated that the average particle size was 242 nm.

Next, the following ingredients were mixed under stirring to prepare a coating solution for a blue image-forming layer.

[Formulation of a Coating Solution for the Blue Image-Forming Layer]

| | |
|---|---|
| n-Propyl alcohol | 321.5 parts |
| Methyl ethyl ketone | 89.3 parts |
| Wax compounds | |
| (Stearic amide "Newtron 2"; made by Nippon Fine Chemical Co., Ltd.) | 0.824 part |
| (Behenic amide "Diamid BM"; made by Nippon Kasei Chemical Co., Ltd.) | 0.824 part |
| (Lauric amide "Diamid Y"; made by Nippon Kasei Chemical Co., Ltd.) | 0.824 part |
| (Palmitic amide "Diamid KP"; made by Nippon Kasei Chemical Co., Ltd.) | 0.824 part |
| (Oleic amide "Diamid O-200"; made by Nippon Kasei Chemical Co., Ltd.) | 0.824 part |
| (Erucic amide "Diamid L-200"; made by Nippon Kasei Chemical Co., Ltd.) | 0.824 part |
| Rosin (KE-311; made by Arakawa Kagaku Co., Ltd.) | 2.360 parts |
| Polyvinyl butyral (Esreck B BL-SH; made by Sekisui Chemical Co., Ltd.) | 1.455 parts |
| Pigment dispersion 3 | 101.80 parts |
| Surfactant (Megafac F-176PF; solid content: 20%; made by Dai-nippon Ink & Chemicals, Inc.) | 1.216 part |

Thermal transfer sheet Y, thermal transfer sheet M, thermal transfer sheet C, thermal transfer sheet K, and an image-forming sheet are the same as in Example 1.

Thus, there was obtained a multi-color image-forming material composed of the thermal transfer sheets B, Y, M and C, and the image-receiving sheet.

EXAMPLE 3

Preparation of Thermal Transfer Sheet G (Green)

A thermal transfer sheet G was prepared in the same manner as with the preparation of the thermal transfer sheet R except for using a coating solution for a green image-forming layer of the following formulation in place of the coating solution for the red image-forming layer. The thickness of the image-forming layer of the resulting thermal transfer sheet G was 0.70 μm.

[Formulation of the Green Pigment Dispersion Mother Liquor]

| | |
|---|---|
| Pigment dispersion 4 | |
| Pigment Green 7 (C.I. No. 74260) (Fastogen Green S; made by Dai-nippon Ink & Chemicals, Inc.) | 8.93 parts |
| Polyvinyl butyral (Esreck B BL-SH; made by Sekisui Chemical Co., Ltd.) | 7.50 parts |
| Dispersing aid (Solsperse S-20000; made by ICI) | 0.47 part |
| n-Propyl alcohol | 83.10 parts |
| Pigment dispersion 5 | |
| Polyvinyl butyral (Esreck B BL-SH; made by Sekisui Chemical Co., Ltd.) | 7.1 parts |
| Pigment Yellow 180 (C.I. No. 21290) (Novoperm Yellow P-HG; made by Clariant Japan K.K.) | 12.9 parts |
| Dispersing aid (Solsperse S-20000; made by ICI) | 0.6 part |
| n-Propyl alcohol | 79.4 parts |

Particle sizes of the thus obtained pigment dispersions 4 and 5 were measured using a laser-scattering type particle size distribution-measuring meter, which indicated that the average particle sizes were 161 nm and 330 nm, respectively.

Next, the following ingredients were mixed under stirring to prepare a coating solution for a green image-forming layer.

[Formulation of a Coating Solution for the Green Image-Forming Layer]

| | |
|---|---|
| n-Propyl alcohol | 321.5 parts |
| Methyl ethyl ketone | 89.3 parts |
| Wax compounds | |
| (Stearic amide "Newtron 2"; made by Nippon Fine Chemical Co., Ltd.) | 0.824 part |
| (Behenic amide "Diamid BM"; made by Nippon Kasei Chemical Co., Ltd.) | 0.824 part |
| (Lauric amide "Diamid Y"; made by Nippon Kasei Chemical Co., Ltd.) | 0.824 part |
| (Palmitic amide "Diamid KP"; made by Nippon Kasei Chemical Co., Ltd.) | 0.824 part |
| (Oleic amide "Diamid O-200"; made by Nippon Kasei Chemical Co., Ltd.) | 0.824 part |
| (Erucic amide "Diamid L-200"; made by Nippon Kasei Chemical Co., Ltd.) | 0.824 part |
| Rosin (KE-311; made by Arakawa Kagaku Co., Ltd.) | 2.360 parts |
| Polyvinyl butyral (Esreck B BL-SH; made by Sekisui Chemical Co., Ltd.) | 1.455 parts |
| Pigment dispersion 4 | 77.11 parts |
| Pigment dispersion 5 | 24.60 |
| Surfactant (Megafac F-176PF; solid content: 20%; made by Dai-nippon Ink & Chemicals, Inc.) | 1.216 part |

Thermal transfer sheet Y, thermal transfer sheet M, thermal transfer sheet C, thermal transfer sheet K, and an image-forming sheet are the same as in Example 1.

Thus, there was obtained a multi-color image-forming material composed of the thermal transfer sheets G, Y, M and C, and the image-receiving sheet.

EXAMPLE 4

Preparation of Thermal Transfer Sheet O (Orange)

A thermal transfer sheet O was prepared in the same manner as with the preparation of the thermal transfer sheet R except for using a coating solution for an orange image-forming layer of the following formulation in place of the coating solution for the red image-forming layer. The thickness of the image-forming layer of the resulting thermal transfer sheet O was 0.55 μm.

[Formulation of the Orange Pigment Dispersion Mother Liquor]

| | |
|---|---|
| Pigment dispersion 6 | |
| Pigment Orange 43 (C.I. No. 71105) (Hosterperm Orange GR; made by Clariant Japan K.K.) | 8.93 parts |
| Polyvinyl butyral (Esreck B BL-SH; made by Sekisui Chemical Co., Ltd.) | 7.50 parts |
| Dispersing aid (Solsperse S-20000; made by ICI) | 0.47 part |
| n-Propyl alcohol | 83.10 parts |
| Pigment dispersion 7 | |
| Polyvinyl butyral (Esreck B BL-SH; made by Sekisui Chemical Co., Ltd.) | 7.1 parts |
| Pigment Yellow 180 (C.I. No. 21290) (Novoperm Yellow P-HG; made by Clariant Japan K.K.) | 12.9 parts |
| Dispersing aid (Solsperse S-20000; made by ICI) | 0.6 part |
| n-Propyl alcohol | 79.4 parts |

Particle sizes of the thus obtained pigment dispersions 6 and 7 were measured using a laser-scattering type particle size distribution-measuring meter, which indicated that the average particle sizes were 261 nm and 330 nm, respectively.

Next, the following ingredients were mixed under stirring to prepare a coating solution for an orange image-forming layer.

[Formulation of a Coating Solution for the Orange Image-Forming Layer]

| | |
|---|---|
| n-Propyl alcohol | 321.5 parts |
| Methyl ethyl ketone | 89.3 parts |
| Wax compounds | |
| (Stearic amide "Newtron 2"; made by Nippon Fine Chemical Co., Ltd.) | 0.824 part |
| (Behenic amide "Diamid BM"; made by Nippon Kasei Chemical Co., Ltd.) | 0.824 part |
| (Lauric amide "Diamid Y"; made by Nippon Kasei Chemical Co., Ltd.) | 0.824 part |
| (Palmitic amide "Diamid KP"; made by Nippon Kasei Chemical Co., Ltd.) | 0.824 part |
| (Oleic amide "Diamid O-200"; made by Nippon Kasei Chemical Co., Ltd.) | 0.824 part |
| (Erucic amide "Diamid L-200"; made by Nippon Kasei Chemical Co., Ltd.) | 0.824 part |
| Rosin (KE-311; made by Arakawa Kagaku Co., Ltd.) | 2.360 parts |
| Polyvinyl butyral (Esreck B BL-SH; made by Sekisui Chemical Co., Ltd.) | 1.455 parts |
| Pigment dispersion 6 | 84.10 parts |
| Pigment dispersion 7 | 17.81 |
| Surfactant (Megafac F-176PF; solid content: 20%; made by Dai-nippon Ink & Chemicals, Inc.) | 1.216 part |

Thermal transfer sheet Y, thermal transfer sheet M, thermal transfer sheet C, thermal transfer sheet K, and an image-forming sheet are the same as in Example 1.

Thus, there was obtained a multi-color image-forming material composed of the thermal transfer sheets O, Y, M and C, and the image-receiving sheet.

COMPARATIVE EXAMPLE 1

A multi-color image-forming material composed of the above-mentioned thermal transfer sheet Y, M and C, and the image-receiving sheet was prepared.

EXAMPLE 1a

Formation of a Transferred Image

Figure 4:
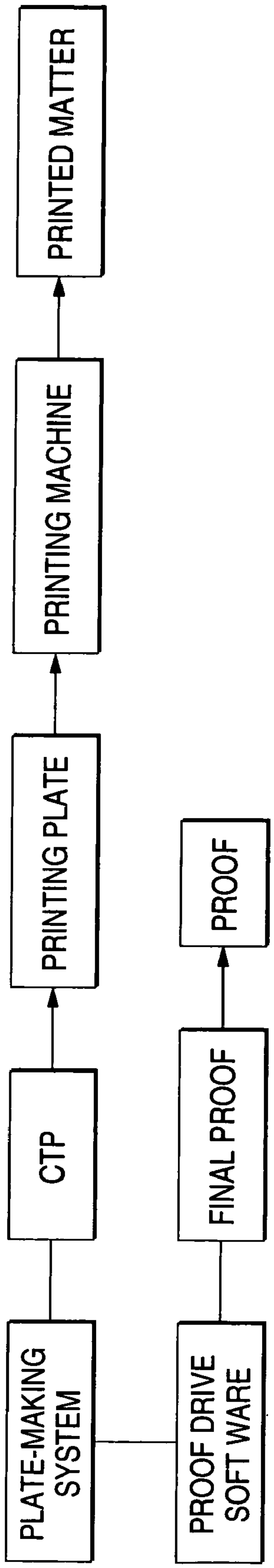
FIG. 4 is a drawing showing an example of a constitution of a system using a recording apparatus, FINALPROOF, for laser thermal transfer.
Figure 5:
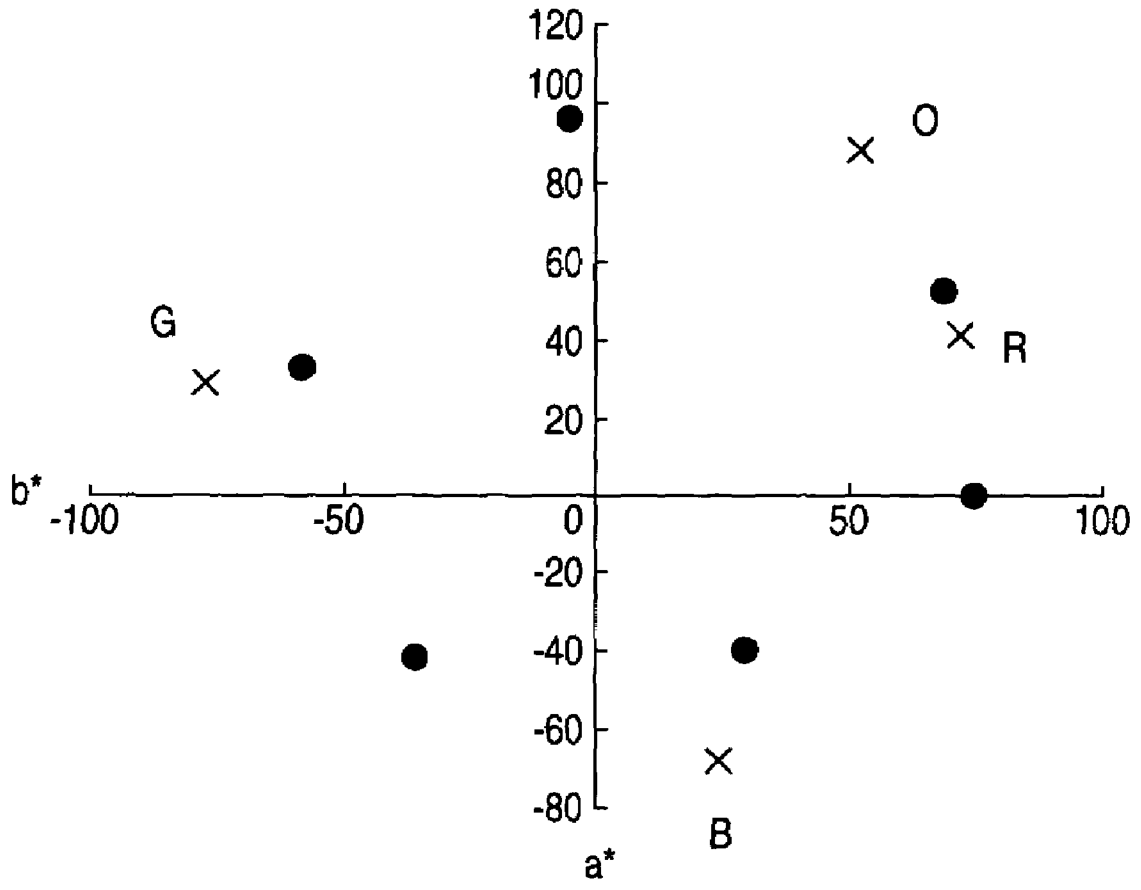
FIG. 5 shows the results of Examples and Comparative Examples on an a*b* plane of an L*a*b* calorimetric system.

The image-forming system was that shown in FIG. 4 using Luxel FINALPROOF 5600 as a recording apparatus. An image transferred to regular paper was obtained by the image-forming sequence of the system and the method employed in the system for transferring to regular paper.

The image-receiving sheet (56 cm×79 cm) prepared above was wound and vacuum-absorbed onto a rotating drum of 38 cm in diameter provided with vacuum section holes of 1 mm in diameter (surface density: 1 hole for an area of 3 cm×8 cm). Then, the thermal transfer sheet R, cut to 61 cm×85 cm, was superimposed on the image-receiving sheet so as to stick out uniformly from the image-receiving sheet. While being squeezed by squeeze rollers, the two sheets were joined and laminated by air-suction through the section holes. The degree of reduced pressure with the section holes thus covered was −150 mmHg (≈81.13 kPa) relative to 1 atmosphere. The drum was rotated, and a semiconductor laser light with a wavelength of 830 nm was focused to form a spot with a diameter of 7 μm on the surface of the light-to-heat conversion layer, and moved (subsidiary scanning) in a direction perpendicular to the rotation direction (main scanning direction) of the recording drum, thus recording a solid image on the laminate. The laser irradiation conditions were as follows. The laser beam used in this Example made use of a laser beam consisting of a multi-beam two-dimensional array forming parallelogram of 5 rows of beams in the main scanning direction and 3 rows of beams in the subsidiary scanning direction.

| | |
|---|---|
| Laser power: | 110 mW |
| Rotation number of the drum: | 500 rpm |
| Subsidiary scanning pitch: | 6.35 μm |
| Environmental temperature and humidity: 3 conditions: | 20° C., 40%; 23° C., 50%; 26° C., 65%. |

The diameter of the drum for exposure is preferably 360 mm or more, and specifically a drum of 380 mm or more in diameter was used.

Additionally, the image size was 515 mm×728 mm, and the resolution was 2600 dpi.

After the laser image recording described above was completed, the laminate was removed from the drum, the thermal transfer sheet R was peeled from the image-receiving sheet by hand, and the image on the image-receiving sheet was further transferred to regular paper by means of the following thermal transfer apparatus to obtain a solid image.

As the thermal transfer apparatus, a transfer apparatus was used where in the material constituting the insertion support had a dynamic friction coefficient to polyethylene terephthalate of 0.1 to 0.7, and the conveying speed was 15 to 50 mm/sec. Also, the Vickers hardness of the material of the heat rolls in the thermal transfer apparatus is preferably 10 to 100 and, specifically, heat rolls of 70 in the Vickers hardness were used.

Also, in the same manner as above, each image was transferred onto the image-receiving sheet using the thermal transfer sheet Y, M or C in place of the above-mentioned thermal transfer sheet R, and, in the same manner as above, a solid image of Y, M or C clor was obtained on regular paper.

Also, a laser light was imagewise irradiated successively on each of the image-forming layers of the thermal transfer sheets R, C, M and Y, and the irradiated portions were successively transferred and superimposed onto the image-receiving sheet to form a predetermined multi-color image on the image-receiving sheet, followed by transferring the multi-color image to regular paper in the same manner as above.

COMPARATIVE EXAMPLE 1a

A solid image with a R color was obtained on regular paper by transferring each image-forming layer on the image receiving sheet in the same manner as in Example 1a except for successively using the thermal transfer sheets Y and M in place of the thermal transfer sheet R. Also, in the same manner as above, a solid image with a color of Y, M or C was obtained on regular paper.

Also, a laser light was imagewise irradiated successively on each of the image-forming layers of the thermal transfer sheets C, M and Y, and the irradiated portions were successively transferred and superimposed onto the image-receiving sheet to form a predetermined multi-color image on the image-receiving sheet, followed by transferring the multi-color image on regular paper in the same manner as above.

EXAMPLE 2a

A solid image with a B color was obtained on regular paper by transferring the image-forming layer on the image receiving sheet in the same manner as in Example 1a except for using the thermal transfer sheet B in place of the thermal transfer sheet R. Also, in the same manner as above, a solid image with a color of Y, M or C was obtained on regular paper.

Also, a laser light was imagewise irradiated successively on each of the image-forming layers of the thermal transfer sheets B, C, M and Y, and the irradiated portions were successively transfered and superimposed onto the image-receiving sheet to form a predetermined multi-color image on the image-receiving sheet, followed by transferring the multi-color image on regular paper in the same manner as above.

COMPARATIVE EXAMPLE 2a

A solid image with a B color was obtained on regular paper by transferring each image-forming layer on the image receiving sheet in the same manner as in Example 2a except for successively using the thermal transfer sheets M and C in place of the thermal transfer sheet B. Also, in the same manner as above, a solid image with a color of Y, M or C was obtained on regular paper.

Also, a laser light was imagewise irradiated successively on each of the image-forming layers of the thermal transfer sheets C, M and Y, and the irradiated portions were successively transferred and superimposed onto the image-receiving sheet to forma predetermined multi-color image on the image-receiving sheet, followed by transferring the multi-color image on regular paper in the same manner as above.

EXAMPLE 3a

A solid image with a G color was obtained on regular paper by transferring the image-forming layer on the image receiving sheet in the same manner as in Example 1a except for using the thermal transfer sheet G in place of the thermal transfer sheet R. Also, in the same manner as above, a solid image with a color of Y, M or C was obtained on regular paper.

Also, a laser light was imagewise irradiated successively on each of the image-forming layers of the thermal transfer sheets G, C, M and Y, and the irradiated portions were successively transferred and superimposed onto the image-receiving sheet to form a predetermined multi-color image on the image-receiving sheet, followed by transferring the multi-color image on regular paper in the same manner as above.

COMPARATIVE EXAMPLE 3a

A solid image with a G color was obtained on regular paper by transferring each image-forming layer on the image receiving sheet in the same manner as in Example 3a except for successively using the thermal transfer sheets C and Y in place of the thermal transfer sheet R. Also, in the same manner as above, a solid image with a color of Y, M or C was obtained on regular paper.

Also, a laser light was imagewise irradiated successively on each of the image-forming layers of the thermal transfer sheets C, M and Y, and the irradiated portions were successively transferred and superimposed onto the image-receiving sheet to form a predetermined multi-color image on the image-receiving sheet, followed by transferring the multi-color image on regular paper in the same manner as above.

EXAMPLE 4a

A solid image with an O color was obtained on regular paper by transferring the image-forming layer on the image receiving sheet in the same manner as in Example 1a except for using the thermal transfer sheet O in place of the thermal transfer sheet R. Also, in the same manner as above, a solid image with a color of Y, M or C was obtained on regular paper.

Also, a laser light was imagewise irradiated successively on each of the image-forming layers of the thermal transfer sheets O, C, M and Y, and the irradiated portions were successively transferred and superimposed onto the image-receiving sheet to form a predetermined multi-color image on the image-receiving sheet, followed by transferring the multi-color image on regular paper in the same manner as above.

The solid images and the multi-color images thus obtained were evaluated as follows.

With the solid images transferred to regular papers, the maximum $OD_r$ of the optical density was measured using a densitometer, X-rite 938 (made by X-rite Co.) through a filter (shown in Table 1) which gives the maximum optical density.

Also, hues of the solid images were measured by means of the above-described densitometer X-rite 938, and elements L*, a* and b* in the L*a*b* calorimetric system were determined. Additionally, the results are shown in FIG. 1 on the a*b* plane.

Also, impressiveness of the letters and the background of the multi-color images formed were compared. O: impressive; X: unimpressive.

The results thus obtained are shown in Table 1.

scope of hues reproducible by the single use or combined use of a thermal transfer sheet for a color of yellow, magenta, cyan or black; and the image-forming layer of the thermal transfer sheet (X) has a hue of L*=48 to 58, a*=69 to 79, b*=36 to 46;
L*=16 to 26, a*=19 to 29, b*=−63 to −73;
L*=57 to 67, a*=−73 to −83, b*=26 to 36; or
L*=65 to 75, a*=50 to 60, b*=81 to 91.

TABLE 1

| | Thermal transfer sheet | Hue | $OD_I$ Maximum Value | $OD_I$ Filter | Thickness of Image-forming Layer (μm) (Ti) | $OD_I/T_I$ | Hue L* | Hue a* | Hue b* | Impressiveness of Letter or Background |
|---|---|---|---|---|---|---|---|---|---|---|
| Example 1a | R | R | 1.55 | G | 0.71 | 2.18 | 53.07 | 71.83 | 40.98 | O |
| Comp. Ex. 1a | Y + M | R | — | — | — | — | 45.84 | 68.57 | 51.99 | X |
| Example 2a | B | B | 2.35 | R | 0.95 | 2.47 | 19.79 | 25.70 | −68.82 | O |
| Comp. Ex. 2a | M + C | B | — | — | — | — | 21.57 | 30.55 | −39.92 | X |
| Example 3a | G | G | 1.34 | R | 0.70 | 1.91 | 61.80 | −76.91 | 31.40 | O |
| Comp. Ex. 3a | C + Y | G | — | — | — | — | 52.40 | −58.44 | 35.26 | X |
| Example 4a | O | O | 1.51 | B | 0.55 | 2.75 | 68.60 | 52.06 | 87.78 | O |
| Examples 1a to 4a, | C | C | 1.59 | R | 0.45 | 3.53 | 58.59 | −35.68 | −41.83 | |
| Comp. Ex. 1a to 3a, | M | M | 1.51 | G | 0.38 | 3.97 | 46.69 | 74.78 | −0.02 | |
| | Y | Y | 1.01 | B | 0.42 | 2.40 | 90.30 | −5.55 | 96.55 | |

Examples of the invention express hues in the color reproduction area in the process color (Comparative Examples) and hues outside the area. Hence, when used for letters or backgrounds, there can be formed a multi-color image with vivid colors and appealing power. Additionally, in FIG. 1, hues X reproducible by the Examples of the invention are outside the hue area of conventional process colors (pentagonal hue region shown by ○).

INDUSTRIAL APPLICABILITY

The multi-color image-forming material of the invention and the method for forming a multi-color image can realize hues outside the color reproduction area in the process color, and therefore can realize hues that cannot have so far been provided, thus having the advantage that the scope of reproducible hues being enlarged and the width of designing being expanded.

The invention claimed is:

1. A method for forming a multi-color image, which comprises:

using an image-receiving sheet having an image-receiving layer and at least five heat transfer sheets including thermal transfer sheets for a color of yellow, magenta, cyan or black, each of which comprises a support having provided thereon at least a light-to-heat conversion layer and an image-forming layer;

superposing the image-forming layer of each of the thermal transfer sheet on the image-receiving layer of the image-receiving sheet, in which the image-forming layer is opposed to the image-receiving layer; and irradiating a laser light thereto to transfer the laser-irradiated area of the image-forming layer to the image-receiving layer of the image-receiving sheet and record an image, wherein the at least five heat transfer sheets include a thermal transfer sheet (X) forming a hue outside the

2. A method for forming a multi-color image, which comprises:

using an image-receiving sheet having an image-receiving layer and at least five heat transfer sheets including thermal transfer sheets for a color of yellow, magenta, cyan or black, each of which comprises a support having provided thereon at least a light-to-heat conversion layer and an image-forming layer;

superposing the image-forming layer of each of the thermal transfer sheet on the image-receiving layer of the image-receiving sheet, in which the image-forming layer is opposed to the image-receiving layer; and irradiating a laser light thereto to transfer the laser-irradiated area of the image-forming layer to the image-receiving layer of the image-receiving sheet and record an image, wherein the at least five thermal transfer sheets include a thermal transfer sheet (X) forming a hue outside the scope of hues reproducible by the single use or combined use of a thermal transfer sheet for a color of yellow, magenta, cyan or black;

the image-forming layer of the thermal transfer sheet (X) has a hue of

L*=48 to 58, a*=69 to 79, b*=36 to 46;
L*=16 to 26, a*=19 to 29, b*=−63 to −73;
L*=57 to 67, a*=−73 to −83, b*=26 to 36; or
L*=65 to 75, a*=50 to 60, b*=81 to 91;

the recording area of the multi-color image is of a size of 515 mm or more×728mm or more; and at least one of the at least five heat transfer sheets is a heat transfer sheet (X) having an image-forming layer containing a pigment selected from the group consisting of Pigment Red 48:1, Pigment Red 48:3, Pigment Green 7, Pigment Blue 15:6, Pigment Blue 60, Pigment Violet 23 and Pigment Orange 43.

* * * * *